United States Patent
Gopalakrishna et al.

(10) Patent No.: US 11,672,103 B2
(45) Date of Patent: Jun. 6, 2023

(54) REMOVABLE ELECTRONICS ENCLOSURE COMPRISING AT LEAST ONE MOVEABLE HEAT SPREADER

(71) Applicant: QUALCOMM Incorporated, San Diego, CA (US)

(72) Inventors: Shankar Gopalakrishna, Bengaluru (IN); Saju Cheeran Verghese Francis, Bangalore (IN); Vivekananda Avvaru, Bengaluru (IN)

(73) Assignee: QUALCOMM INCORPORATED, San Diego, CA (US)

( * ) Notice: Subject to any disclaimer, the term of this patent is extended or adjusted under 35 U.S.C. 154(b) by 559 days.

(21) Appl. No.: 16/811,817

(22) Filed: Mar. 6, 2020

(65) Prior Publication Data

US 2021/0282300 A1  Sep. 9, 2021

(51) Int. Cl.
*F28F 7/00* (2006.01)
*H05K 7/20* (2006.01)
*H05K 5/02* (2006.01)

(52) U.S. Cl.
CPC ....... *H05K 7/20509* (2013.01); *H05K 5/0217* (2013.01)

(58) Field of Classification Search
CPC ........... H05K 7/20445; H05K 7/20436; H05K 7/1452; H05K 7/20418; H05K 5/0217; H05K 7/20509
USPC ...................................................... 165/80.2
See application file for complete search history.

(56) References Cited

U.S. PATENT DOCUMENTS

| | | | | |
|---|---|---|---|---|
| 9,655,281 | B2* | 5/2017 | Harvilchuck | F16L 37/18 |
| 10,136,556 | B2* | 11/2018 | Bilski | H05K 7/20672 |
| 10,980,154 | B1* | 4/2021 | Gao | H05K 7/20781 |
| 2009/0161312 | A1* | 6/2009 | Spearing | H05K 7/20781 |
| | | | | 361/679.53 |
| 2014/0362531 | A1* | 12/2014 | Lee | H05K 7/2039 |
| | | | | 361/699 |
| 2018/0321715 | A1* | 11/2018 | Gopalakrishna | G06F 1/20 |
| 2019/0182982 | A1* | 6/2019 | Gopalakrishna | H05K 7/20172 |
| 2021/0282300 | A1* | 9/2021 | Gopalakrishna | H05K 7/20509 |

FOREIGN PATENT DOCUMENTS

| | | | |
|---|---|---|---|
| EP | 3582597 A1 | 12/2019 | |
| FR | 2979793 A1 | 3/2013 | |

OTHER PUBLICATIONS

International Search Report and Written Opinion—PCT/US2021/019330—ISA/EPO—dated Jun. 9, 2021.

* cited by examiner

*Primary Examiner* — Claire E Rojohn, III
(74) *Attorney, Agent, or Firm* — Loza & Loza, LLP

(57) ABSTRACT

An electronics enclosure can be a line replaceable unit for installation in a chassis having actively cooled cold plates. The electronics enclosure has a housing, heat spreaders, and moveable heat spreaders. The electronics enclosure can be positioned in the chassis with the moveable heat spreaders close to the housing and thereafter the moveable heat spreaders can be moved away from the housing to press against the cold plates. Heat from electronics within the electronics enclosure can pass from the housing, through the heat spreaders, through the moveable heat spreaders, and into the cold plates.

12 Claims, 14 Drawing Sheets

*Perspective View*

Perspective View

Perspective View

Top View

Top View

Top View

Top View

Top View

Top View

Top View

Top View

Top View

```
                              ┌─ 905
                      ( Start )
                          │                                    910
                          ▼                                     )
┌─────────────────────────────────────────────────────────────────┐
│ INSERT THE ELECTRONICS ENCLOSURE INTO A CHASSIS, THE            │
│ CHASSIS INCLUDING AT LEAST ONE COLD PLATE THAT IS ACTIVELY      │
│ COOLED, THE HOUSING DEVICE INCLUDING:                           │
│ (I) A HOUSING CONFIGURED AS AN ENCLOSURE FOR ELECTRONIC         │
│ DEVICES; (II) AT LEAST ONE HEAT SPREADER COUPLED TO AT LEAST    │
│ ONE SURFACE OF THE HOUSING, WHEREIN THE AT LEAST ONE HEAT       │
│ SPREADER COMPRISES AT LEAST ONE WEDGE; (III) AT LEAST ONE       │
│ MOVEABLE HEAT SPREADER COUPLED TO THE AT LEAST ONE HEAT         │
│ SPREADER, WHEREIN THE AT LEAST ONE MOVEABLE HEAT SPREADER       │
│ IS CONFIGURED TO BE MOVEABLE RELATIVE TO THE HOUSING,           │
│ WHEREIN THE AT LEAST ONE MOVEABLE HEAT SPREADER INCLUDES        │
│ AT LEAST ONE OUTER WEDGE CONFIGURED TO COUPLE TO THE AT         │
│ LEAST ONE WEDGE OF THE AT LEAST ONE HEAT SPREADER, WHEREIN      │
│ THE AT LEAST ONE MOVEABLE AT LEAST ONE OUTER WEDGE IS IN        │
│ SLIDABLE CONTACT WITH THE AT LEAST ONE WEDGE SUCH THAT          │
│ PRESSING THE AT LEAST ONE MOVEABLE HEAT SPREADER IN A FIRST     │
│ DIRECTION CAUSES THE AT LEAST ONE MOVEABLE HEAT SPREADER        │
│ TO SLIDE AGAINST THE AT LEAST ONE HEAT SPREADER AND MOVE        │
│ AWAY FROM THE HOUSING; AND (IV) A FRONT FACE COUPLED TO THE     │
│ AT LEAST ONE MOVEABLE HEAT SPREADER SUCH THAT PRESSING          │
│ THE FRONT FACE IN THE FIRST DIRECTION PRESSES THE AT LEAST      │
│ ONE MOVEABLE HEAT SPREADER IN THE FIRST DIRECTION.              │
└─────────────────────────────────────────────────────────────────┘
                          │                                 ┌─ 915
                          ▼                                  )
┌─────────────────────────────────────────────────────────────────┐
│ MOVE OR ACTUATE THE FRONT FACE IN A FIRST DIRECTION RELATIVE    │
│ TO THE HOUSING THEREBY CAUSING THE AT LEAST ONE FLOATING        │
│ HEAT SPREADER TO PRESS AGAINST AT LEAST ONE OF THE AT LEAST     │
│ ONE COLD PLATE.                                                 │
└─────────────────────────────────────────────────────────────────┘
                          │
                          ▼
┌─────────────────────────────────────────────────────────────────┐
│ LOCK THE ELECTRONICS ENCLOSURE IN PLACE WITHIN THE CHASSIS,     │
│ THE AT LEAST ONE FLOATING HEAT SPREADER PRESSING AGAINST        │
│ THE AT LEAST ONE COLD PLATE TO HOLD THE ELECTRONICS             │
│ ENCLOSURE IN PLACE WITHIN THE CHASSIS.                          │
└─────────────────────────────────────────────────────────────────┘
                          │
                          ▼
                      (  End  )
                            ─ 925            920
```

FIG. 9A

Top View

Cross Sectional View

*Cross Sectional View*

*Cross Sectional View*

Cross Sectional View

Cross Sectional View

Cross Sectional View

Perspective View

*Perspective View*

*Cross Sectional View*

*Cross Sectional View*

REMOVABLE ELECTRONICS ENCLOSURE COMPRISING AT LEAST ONE MOVEABLE HEAT SPREADER

FIELD

Various features relate to electronics enclosures having heat spreaders, but more specifically to electronics enclosures having moveable heat spreaders.

BACKGROUND

Electronics enclosures such as those for electronic system components are getting more thermally challenging to cool due to increased power consumption and heat generation by the electronic devices located in the enclosures. Greater heat generation by electronic devices leads to a need to dissipate greater amounts of heat. The cooling of the electronics modules with forced airflow may be used but is reaching its limits as heat generating components can be tightly packed on both sides of an enclosure. There is an ongoing need to provide devices and enclosures that provide greater cooling for the enclosure's electronics while also making the enclosure more serviceable.

SUMMARY

Various features relate to electronics enclosures having heat spreaders, but more specifically to electronics enclosures having moveable heat spreaders.

One example provides a device that includes a housing, a heat spreader and a moveable heat spreader. The housing is configured as an enclosure for at least one electronic device. The heat spreader is coupled to at least one surface of the housing and may include at least one wedge. The moveable heat spreader is coupled to the heat spreader. The moveable heat spreader is configured to be moveable relative to the housing. The moveable heat spreader includes at least one outer wedge configured to couple to the at least one wedge of the heat spreader. The at least one outer wedge is configured to be in slidable contact with the at least one wedge such that pressing the at least one moveable heat spreader in a first direction causes the moveable heat spreader to slide against the heat spreader and move away from the housing.

In one exemplary implementation, the heat spreader may further include a first heat spreader and a second heat spreader. The first heat spreader may be located over a first surface of the housing. The second heat spreader may be located over a second surface of the housing, wherein the second surface is opposite to the first surface. Additionally, the moveable heat spreader may comprise a first moveable heat spreader slidably contacting the first heat spreader, and a second moveable heat spreader slidably contacting the second heat spreader.

In on example, the device may also comprise a front face coupled to the moveable heat spreader such that pressing the front face in the first direction causes the moveable heat spreader to move in the first direction. The moveable heat spreader may be configured to move perpendicularly to the first direction relative to the front face.

Additionally, the device may include a shoulder screw slot defined in the front face, and a shoulder screw located in the shoulder screw slot, wherein the shoulder screw is configured to coupling the moveable heat spreader to the front face such that the moveable heat spreader slides perpendicularly to the front face.

The device may also include a plurality of fasteners pulling the moveable heat spreader into the heat spreader. The moveable heat spreader may also include a plurality of sliding nut slots, and each of the plurality of fasteners includes a sliding nut positioned in one of the plurality of sliding nut slots.

In various implementations, the heat spreader may be a separate component to the housing or it may be formed part of the housing.

In one example, when the device is configured to be inserted into a host chassis, heat from within the housing is conducted through the heat spreader, through the moveable heat spreader, and into the cold plate of the host chassis.

Another example provides an apparatus that includes a housing, first means for conducting heat from the housing, second means for conducting heat, and means for redirecting movement of the apparatus. The housing is configured for enclosing at least one electronic device. The second means for conducting heat is configured to conduct heat away from the housing. The means for redirecting movement of the apparatus comprises redirecting movement in a first direction into movement of the second means for conducting heat in a second direction away from the housing.

Another example provides a method that includes inserting a device into a chassis. The chassis includes a cold plate that is configured to dissipate heat. The device may include (i) a housing configured as an enclosure for electronic devices; (ii) a heat spreader coupled to a surface of the housing, wherein the heat spreader includes at least one wedge; (iii) a moveable heat spreader coupled to the heat spreader, wherein the moveable heat spreader is configured to be moveable relative to the housing, the moveable heat spreader includes at least one outer wedge slidably coupled to the at least one wedge of the heat spreader; and (iv) a front face coupled to the moveable heat spreader. The front face is actuated in a first direction relative to the housing to cause the moveable heat spreader to press against the cold plate. The device locks in place within the chassis. The heat spreader may include: (a) a first heat spreader on a first surface of the housing, and (b) a second heat spreader on a second surface of the housing, wherein the moveable heat spreader includes (i) a first moveable heat spreader slidably contacting the first heat spreader, and (ii) a second moveable heat spreader slidably contacting the second heat spreader.

DETAILED DESCRIPTION

In the following description, specific details are given to provide a thorough understanding of the various aspects of the disclosure. However, it will be understood by one of ordinary skill in the art that the aspects may be practiced without these specific details. For example, structures may be shown in block diagrams in order to avoid obscuring the aspects in unnecessary detail. In other instances, well-known circuits, structures and techniques may not be shown in detail in order not to obscure the aspects of the disclosure.

The present disclosure describes a device (e.g., enclosure, electronics enclosure) that includes a housing, a front face, one or more heat spreaders, and one or more moveable heat spreaders. The device may be installed in a chassis by positioning the device in the chassis and then moving the moveable heat spreaders away from the housing and toward the cold plates of the chassis. The device may be coupled (e.g., locked) to the chassis when the moveable heat spreaders are pressed against the cold plates. With the device coupled to the chassis, heat generated by electronics inside the housing, can travel through the housing and the heat spreaders. The moveable heat spreaders may be coupled (e.g., in contact, touching) to the heat spreaders. The heat may then travel through the moveable heat spreaders. The moveable heat spreaders may be coupled to at least one cold plate. The heat may then travel to the cold plates. The front face may be coupled to the moveable heat spreaders. The front face may be pushed and/or pulled to cause the moveable heat spreaders to move away or towards the housing. The use of the moveable heat spreaders may provide a device that can be easily coupled and decoupled (e.g., inserted and removed) to a chassis, while also providing improved heat dissipation.

Exemplary Device Comprising Heat Spreaders and Moveable Heat Spreaders

Figure 1:
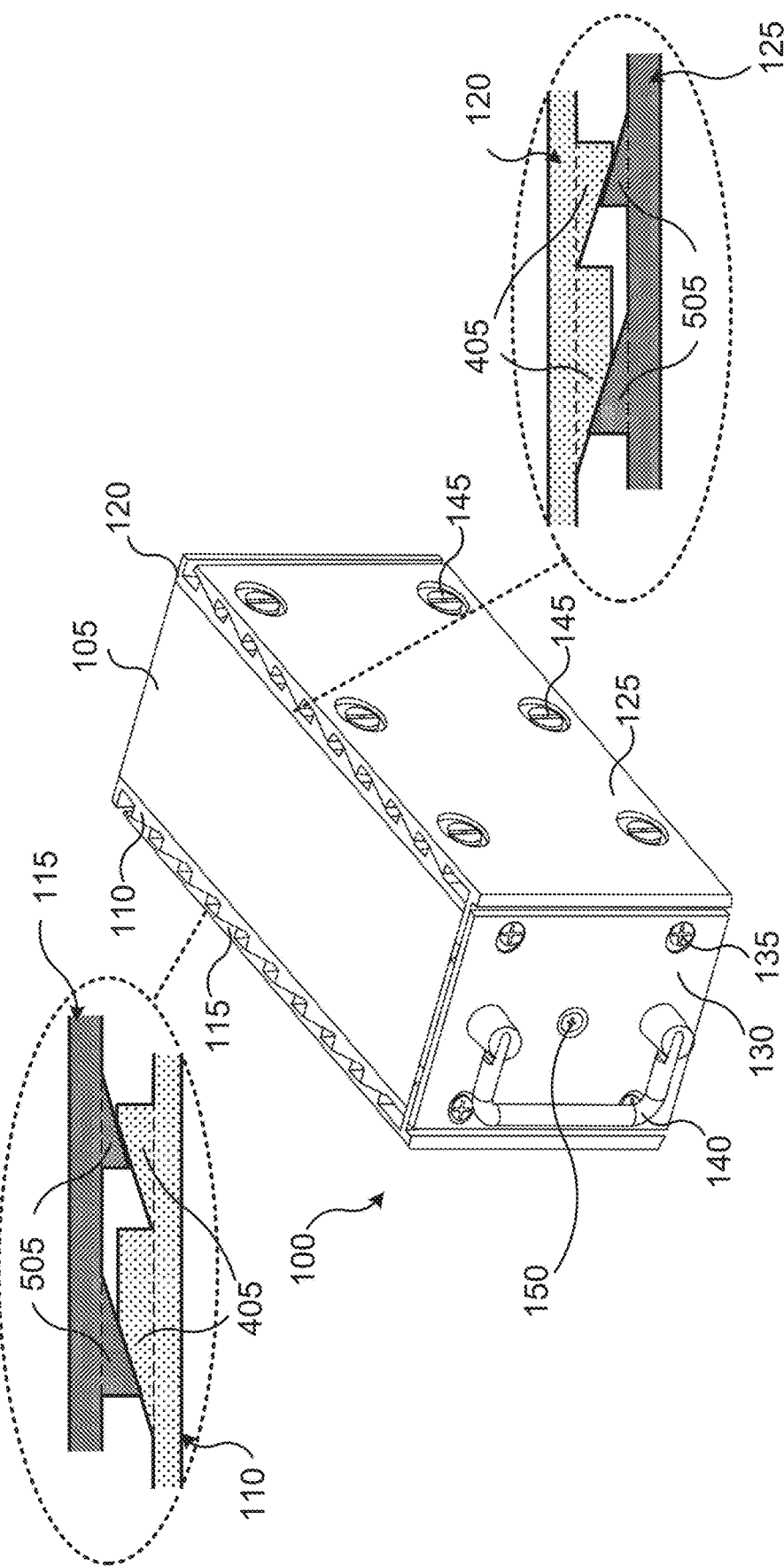
FIG. 1 illustrates a perspective view of an exemplary electronics enclosure including heat spreaders and moveable heat spreaders.

FIG. 1 illustrates a perspective view of a device 100 that includes a housing 105, a heat spreader 110, a heat spreader 120, a moveable heat spreader 115, a moveable heat spreader 125, a front face 130, a plurality of couplers 135, a plurality of heat spreader couplers 145, and a locking device 150.

The housing 105 includes walls to create a space where electronic devices may be located in. The housing 105 may have an opening (not visible) through which electronic devices may be placed inside the housing 105. The housing 105 may be a unibody housing or may include several components that form the housing 105. The housing 105 may have different shapes and/or sizes. Different implementations may use different materials for the housing 105, such as a metal (e.g., copper, aluminum), any high thermally conductive material, or combinations thereof.

The heat spreader 110 (e.g., first heat spreader, first means for conducting heat) is coupled to a surface (e.g., first surface) of the housing 105. The heat spreader 120 (e.g., first heat spreader) is coupled to another surface (e.g., second surface) of the housing 105. The second surface of the housing 105 may be an opposite surface of the first surface of the housing 105. As will be further described in detail below, the heat spreaders 110 and 120 may each include at least one wedge (e.g., 405) and/or at least one wedge surface. In some implementations, the at least one wedge (e.g., 405) may be part of the heat spreaders 110 and/or 120. For example, the at least one wedge (e.g., 545) may be defined from at least one portion of the heat spreaders 110 and/or 120. In some implementations, the at least one wedge (e.g., 405) may be a separate component that is coupled to the heat spreaders 110 and/or 120. The heat spreaders 110 and/or 120 may separate components from the housing 105. In some implementations, the heat spreaders 110 and/or 120 (including the wedge and/or wedge surface) may be implemented as part of the housing 105. For example, the housing 105 may include at least one wedge and/or at least one wedge surface. Thus, in some implementations, the heat spreaders 110 and/or 120 may be considered part of the housing 105. The heat spreaders 110 and/or 120 may include the same material or different materials as the housing 105. The heat spreaders 110 and/or 120 may be fixed relative to the housing 105 or may be moveable relative to the housing 105. Different implementations may have different numbers of heat spreaders that may be located on different surfaces (e.g., bottom surface, top surface, side surface) of the housing 105 or implemented in different surfaces of the housing 105. Different implementations may use different materials for the heat spreaders 110 and/or 120, such as a metal (e.g., copper, aluminum), any high thermally conductive material, or combinations thereof.

The moveable heat spreader 115 (e.g., first moveable heat spreader) is configured to be coupled to the heat spreader 110 through the use of a plurality of heat spreader couplers (not visible, but similar to the plurality of heat spreader couplers 145). The moveable heat spreader 125 (e.g., second moveable heat spreader, second means for conducting heat) is configured to be coupled to the heat spreader 120 through the use of a plurality of heat spreader couplers 145. The plurality of heat spreader couplers 145 may include fasteners. The moveable heat spreaders 115 and/or 125 may each include at least one outer wedge (e.g. 505) and/or at least one outer wedge surface. In some implementations, the at least one outer wedge (e.g., 505) may be part of the moveable heat spreaders 115 and/or 125. For example, the at least one outer wedge (e.g., 505) may be defined from at least one portion of the moveable heat spreaders 115 and/or 125. In some implementations, the at least one outer wedge (e.g., 505) may be a separate component that is coupled to the moveable heat spreaders 115 and/or 125.

The side of the moveable heat spreader 115 that includes an outer wedge faces the side of the heat spreader 110 that includes the wedge. Similarly, the side of the moveable heat spreader 125 that includes an outer wedge faces the side of the heat spreader 120 that includes the wedge. As will be further described below, the wedge of a heat spreader (e.g., 110, 120) and the outer wedge of a moveable heat spreader (e.g., 115, 125) may be configured to allow the moveable heat spreader to slide back and forth over the heat spreader.

The wedges (e.g., 405) and outer wedges (e.g., 505) may have similar or different designs. A wedge and/or an outer wedge may include a component (or portion of a component) that has a thick end that tapers towards a thin edge (or smaller end). The wedges and outer wedges may have angled faces and/or surfaces (e.g., tapered surface, angled surface). The wedge and/or outer edge may be configured to operate as a ramp that can move another component, as the other component moves along the wedge or outer wedge. For example, another component that moves along a tapered surface of the wedge and/or a tapered surface of the outer wedge may move away or towards a component depending on the direction of the movement of the another component. Examples of how the wedges (e.g., 405) and outer wedges (e.g., 505) may move relative to one another is illustrated and described in FIGS. 8A-8D. Conductive heat may flow and/or travel through one or more coupling regions (e.g., contract region, touch region) between the heat spreader and the moveable heat spreader. A thermal conductor, such as a thermally conductive grease at the coupling regions may help increase thermal conductivity at the coupling regions.

The plurality of heat spreader couplers 145 help ensure that the heat spreader and the moveable heat spreader are near each other or touching each other. The plurality of heat spreader couplers 145 may help allow the moveable heat spreader (e.g., 115, 125) to move (e.g., slide) relative to the heat spreader (e.g., 110, 120) and/or the housing 105. As mentioned above, the plurality of heat spreader couplers 145 may include fasteners. The plurality of heat spreader couplers 145 may include one or more springs to help push and/or pull wedges and outer wedges together and/or apart. Different implementations may have different numbers of heat spreader couplers 145 having different locations, different sizes and/or different shapes.

The front face 130 is configured to be coupled to the moveable heat spreaders 115 and/or 125 through the plurality of couplers 135. The plurality of couplers 135 may be configured to allow the front face 130 to move (e.g., slide back and forth) relative to the moveable heat spreader 115 and/or 125, and vice versa. In some implementations, the plurality of couplers 135 may be similar to the plurality of heat spreader couplers 145. Different implementations may have different numbers of couplers 135 having different locations, different sizes and/or different shapes.

A handle 140 may be coupled to the front face 130. A locking device 150 may be coupled to the front face 130. The locking device 150 may be configured to couple the front face 130 to the housing 105. The locking device 150 may be configured to set the front face 130 and/or the moveable heat spreaders (e.g., 115, 125) in a first position (e.g., locked position). The locking device 150 may include a screw. A front side of the housing 105 may include a hole (e.g., threaded hole) through which the screw may travel. In some implementations, the first position is a position in which the moveable heat spreaders (e.g., 115, 125) are coupled (e.g., touching, in contact) with cold plates of a chassis.

Figure 2:
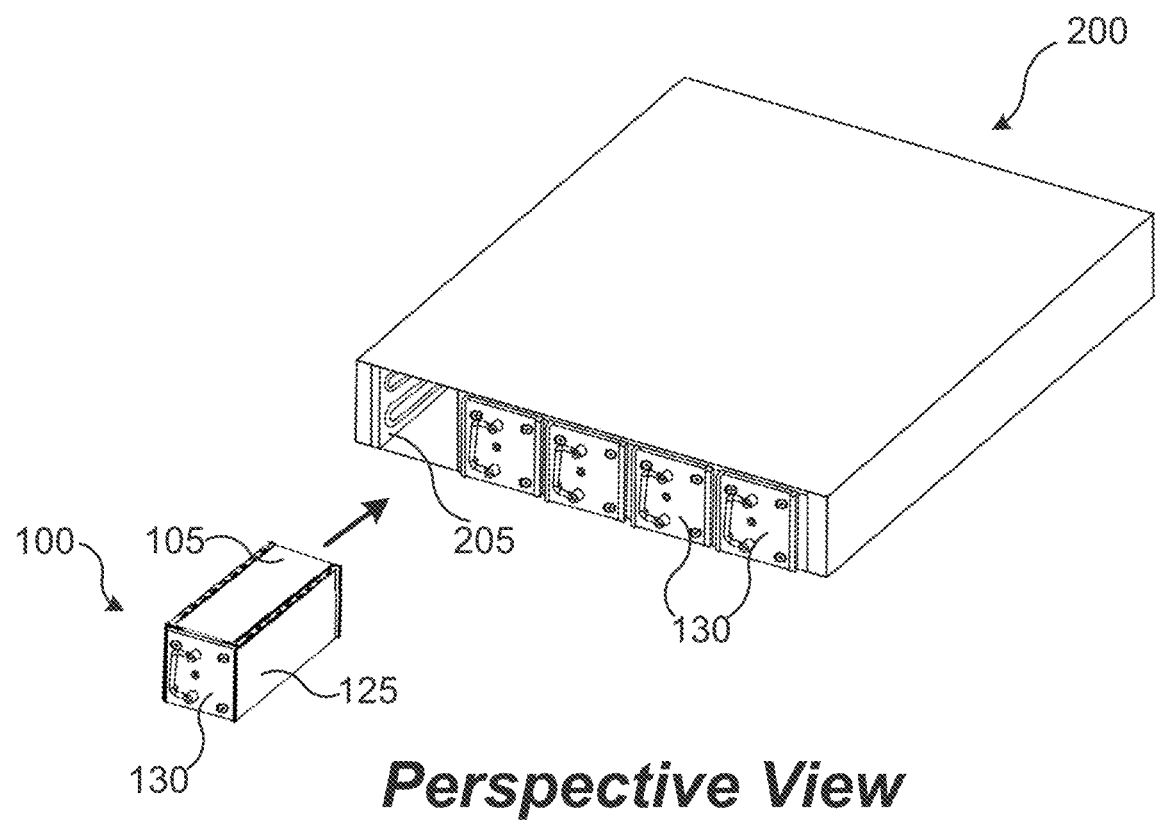
FIG. 2 illustrates a perspective view of an exemplary chassis.

FIG. 2 illustrates a perspective view of a chassis 200 that includes a plurality of cold plates 205 that can each be configured to be actively cooled. A cold plate 205 can be actively cooled by a fluid (e.g., water, coolant) that cycles through the cold plate 205. Heat is removed from the chassis by the fluid exiting the chassis 200. In the illustrated nonlimiting embodiment, the chassis 200 has five bays for the device 100 (e.g., enclosure, electronics enclosure). Four of those bays are occupied. The device 100 that includes the housing 105, the front face 130, the heat spreader 115 and the moveable heat spreader 125, may be placed into an open bay and locked into the open bay.

Figure 3:
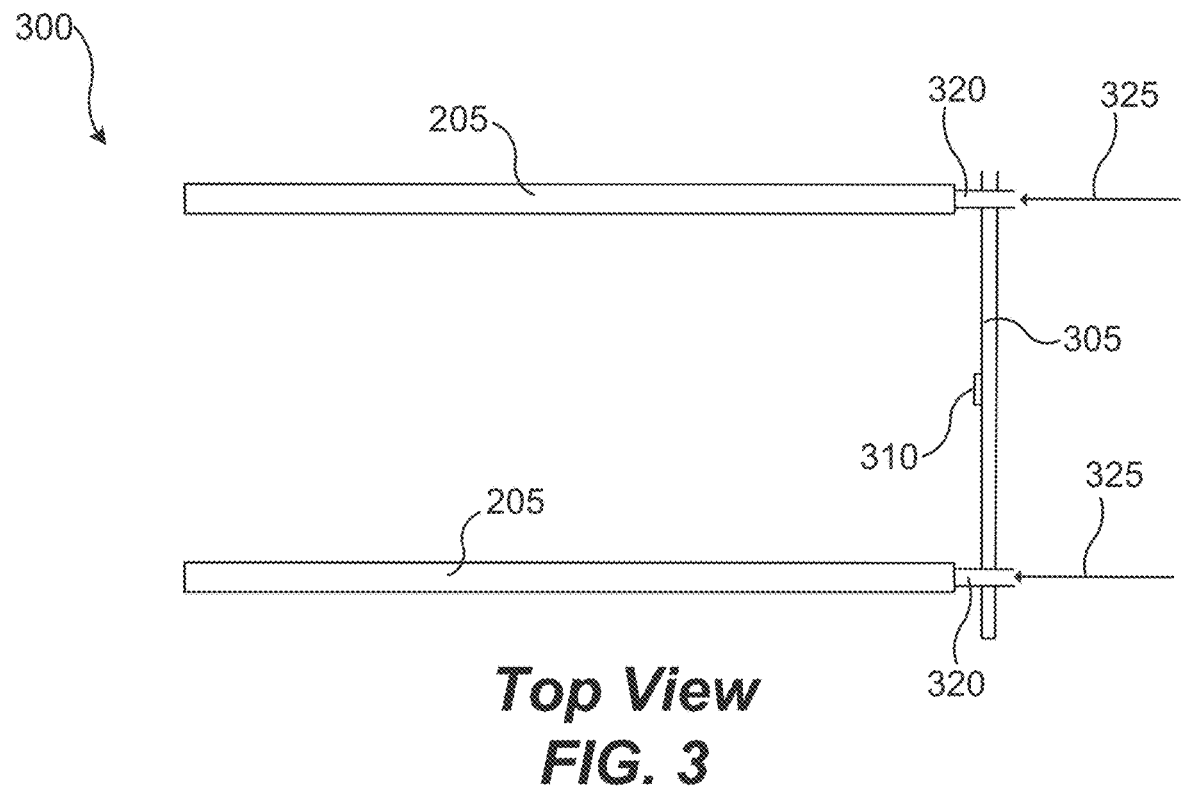
FIG. 3 illustrates a top view of exemplary cold plates and an exemplary backplane.

FIG. 3 illustrates a top view of a cold plate assembly 300 that includes the plurality of cold plates 205 and a backplane 305. The cold plate assembly 300 may be implemented in the chassis 200. The chassis 200 may include several cold plate assemblies 300. One or more tubes 320 (e.g., inflow tube) may be located in the cold plate 205. The tubes 320 may carry fluid to the cold plate 205 where the fluid can circulate and absorb heat. The flow direction 325 indicates flow into the tubes 320. The fluid may exit the cold plate 205 through an outflow tube (not shown). The backplane 305 can provide electrical power and signaling to the device 100 through a backplane connector 310. As will be further described below the backplane connector 310 may be coupled (e.g., electrically coupled) to a connector of the device 100 and/or the housing 105.

Figure 4:
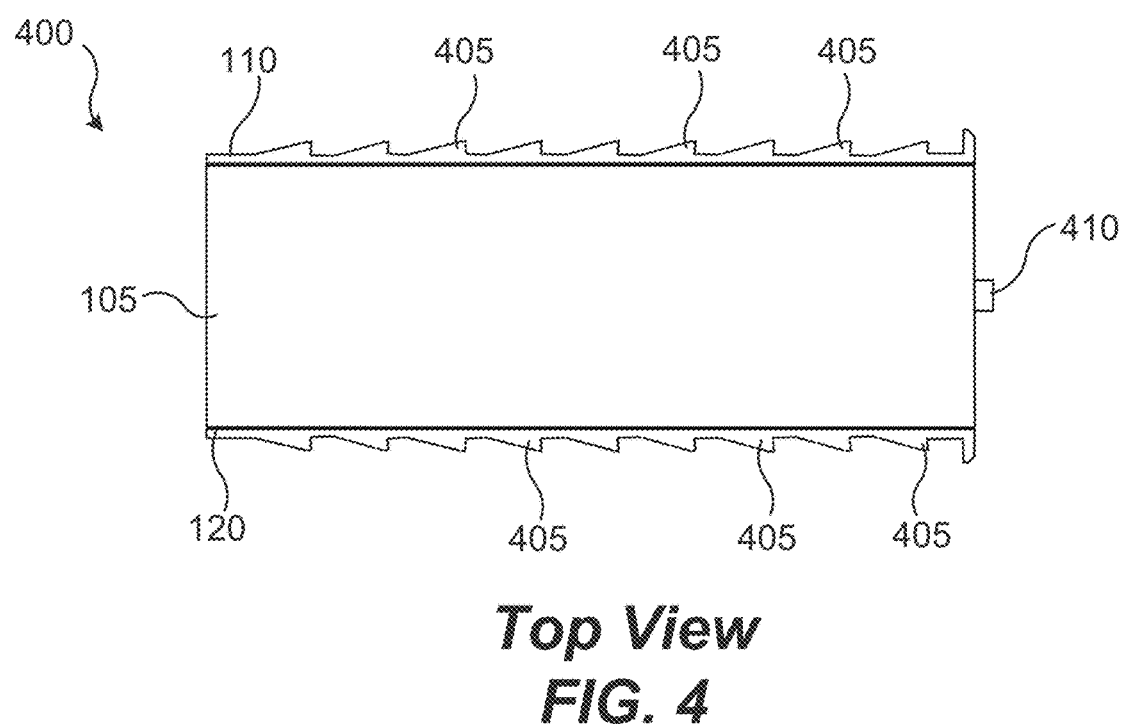
FIG. 4 illustrates a top view of an exemplary housing with exemplary heat spreaders.

FIG. 4 illustrates a top view of a housing assembly 400 that includes the housing 105, the heat spreaders 110 and 120, and the housing connector 410. The housing connector 410 may be a device connector (e.g., enclosure connector). One or more heat generating electronic components (e.g., electronic devices) may be located inside the housing 105. The electronic components can receive power and signals through the housing connector 410. The heat spreaders 110 and 120 may each have a plurality of wedges 405 (e.g., wedge surfaces).

Figure 5:
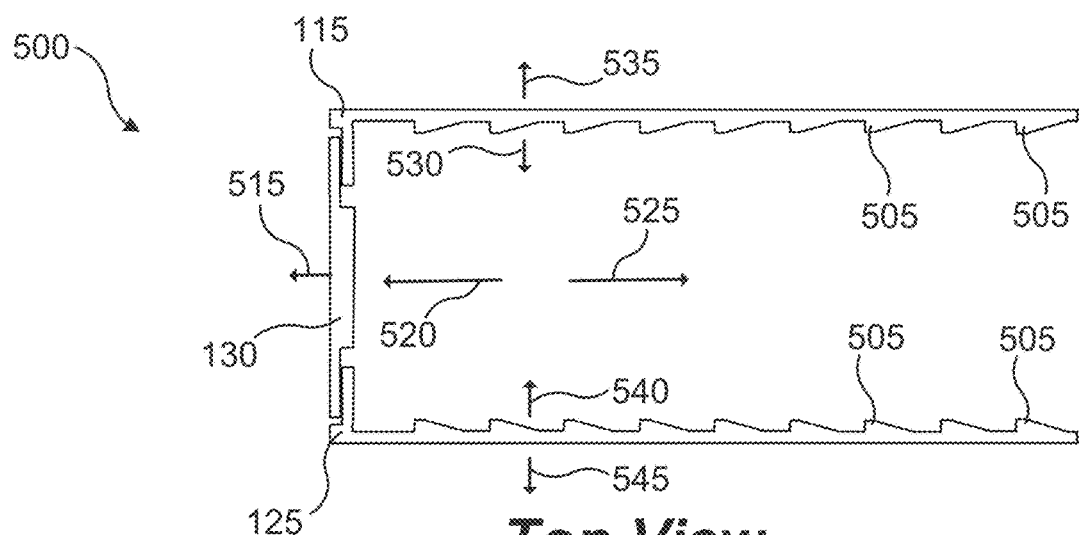
FIG. 5 illustrates a top view of an exemplary front face slidably coupled to exemplary moveable heat spreaders.

FIG. 5 illustrates a top view of an assembly 500 that includes the front face 130, the moveable heat spreaders 115 and 125. Each of the moveable heat spreaders 115 and 125 includes a plurality of outer wedges 505 (e.g., outer wedge surfaces). The plurality of outer wedges 505 face inwards. For example, the outer wedges 505 from the moveable heat spreader 115 faces the outer wedges 505 from the moveable heat spreader 125. The moveable heat spreaders 115 and 125 are each coupled to the front face 130 (e.g., through the use of couplers 135, which for the purpose of clarity, are not shown in FIG. 5). The moveable heat spreaders 115 and 125 may be moveable relative to the front face 130. The front face 130 has a front face normal 515 which is a vector perpendicular to the plane of the front face 130. The front face 130 can be moved in a first direction 525, also called the install direction, when the device 100 is installed in the chassis 200. The front face 130 can be moved in an uninstall direction 520 which is opposite the first direction 525. As will be further described in FIGS. 8A-8C, the outer wedges 505 may slide over the wedges 405 of the heat spreader 110 and/or 120. The moveable heat spreaders 115 and/or 125 may move relative to the housing 105 and/or the heat spreaders 110 and/or 120, at an angle dictated by the angle of the wedges and/or angles of the outer wedges.

As the front face 130 moves in a direction 525, the moveable heat spreader 115 may move in a direction that includes a direction 535, and the moveable heat spreader 125 may move in a direction that includes a direction 545. As the front face 130 moves in a direction 525, the moveable heat spreader 115 and the moveable heat spreader 125 may also move in a direction that includes the direction 525. As the front face 130 moves in a direction 520, the moveable heat spreader 115 may move in a direction that includes a direction 530, and the moveable heat spreader 125 may move in a direction that includes a direction 540. As the front face 130 moves in a direction 520, the moveable heat spreader 115 and the moveable heat spreader 125 may also move in a direction that includes the direction 520.

The front face is an example of means for moving the at least one moveable heat spreader, the means for moving the at least one heat spreader being moveable in the first direction and opposite the first direction, the means for moving the at least one moveable heat spreader being slidably attached to the at least one moveable heat spreader.

Figure 6:
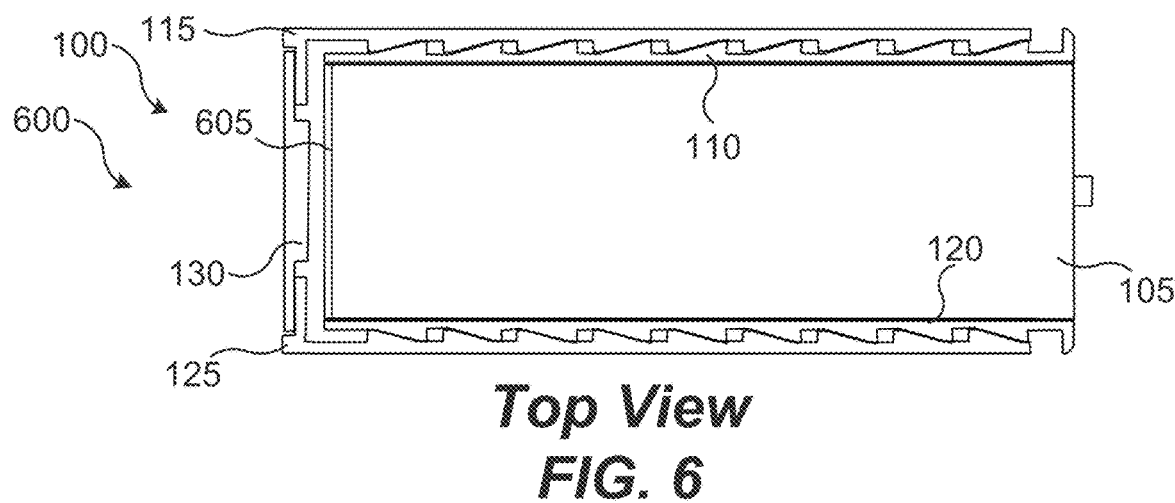
FIG. 6 illustrates a top view of an exemplary electronics enclosure with exemplary moveable heat spreaders close to the housing.

FIG. 6 illustrates a top view of the device 100 that includes the housing 105, the heat spreaders 110 and 120, the moveable heat spreaders 115 and 125, and the front face 130. In the configuration 600 of the device 100, the front face 130 may be close to the housing 105, such that there is gap 605 between the front face 130 and the housing 105. In the configuration 600, the moveable heat spreaders 115 and 125 may be in a retracted position, such that the moveable heat spreaders 115 and 125 are not fully positioned away from the housing 105. When the device 100 is located in the chassis 200, and the device is in the configuration 600, the moveable heat spreaders 115 and 125 may not touching the cold plates 205 inside the chassis 200.

Figure 7:
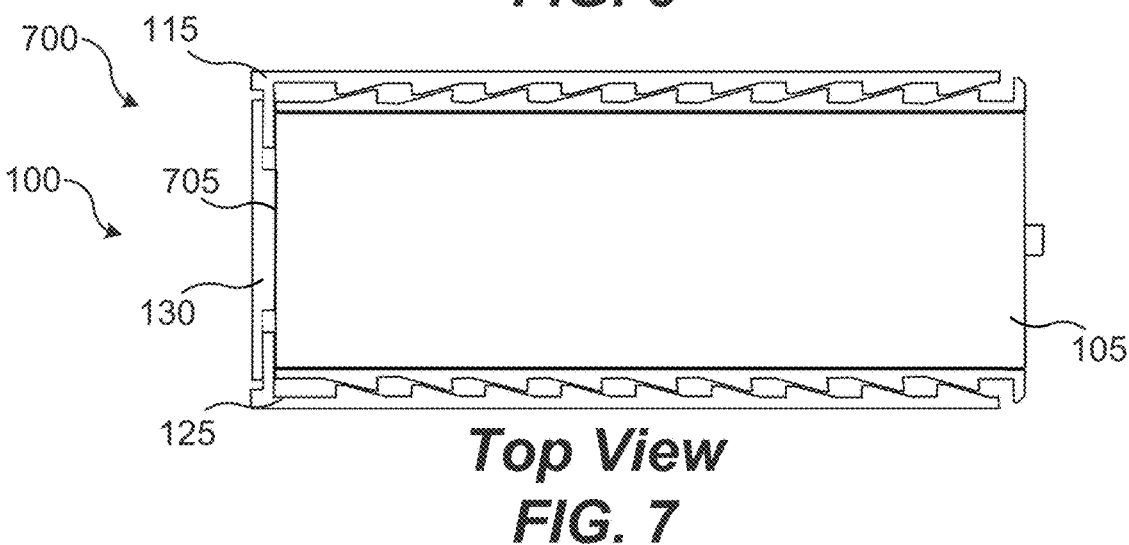
FIG. 7 illustrates a top view of the exemplary electronics enclosure of FIG. 6 but with the exemplary moveable heat spreaders moved away from the housing.

FIG. 7 illustrates a top view of the device 100 of FIG. 6 but in a configuration 700. In the configuration 700, the moveable heat spreaders 115 and 125 are positioned away from the housing 105. In the configuration 700, there may be a gap 705 between the front face 130 and the housing 105. The gap 705 may be less than the gap 605 of FIG. 6. In some implementations, there may not be a gap between the front face 130 and the housing 105. In the configuration 700, the moveable heat spreaders 115 and 125 may be in an extended position, such that the moveable heat spreaders 115 and 125 are positioned away from the housing 105. When the device 100 is located in the chassis 200, and the device is in the configuration 700, the moveable heat spreaders 115 and 125 may be coupled (e.g., touching) the cold plates 205 inside the chassis 200.

FIG. 8 (comprising FIGS. 8A-8D) illustrates a top view of an exemplary sequence for positioning a device that includes heat spreaders and moveable heat spreaders, between cold plates. In some implementations, the sequence of FIGS. 8A-8D may be used to position the device 100 that includes heat spreaders and moveable heat spreaders into a chassis having cold plates.

It should be noted that the sequence of FIGS. 8A-8D may combine one or more stages in order to simplify and/or clarify the sequence for positioning a device with heat spreaders and moveable heat spreaders between the exemplary cold plates. In some implementations, the order of the processes may be changed or modified. In some implementations, one or more of processes may be replaced or substituted without departing from the spirit of the disclosure.

Figure 8A:
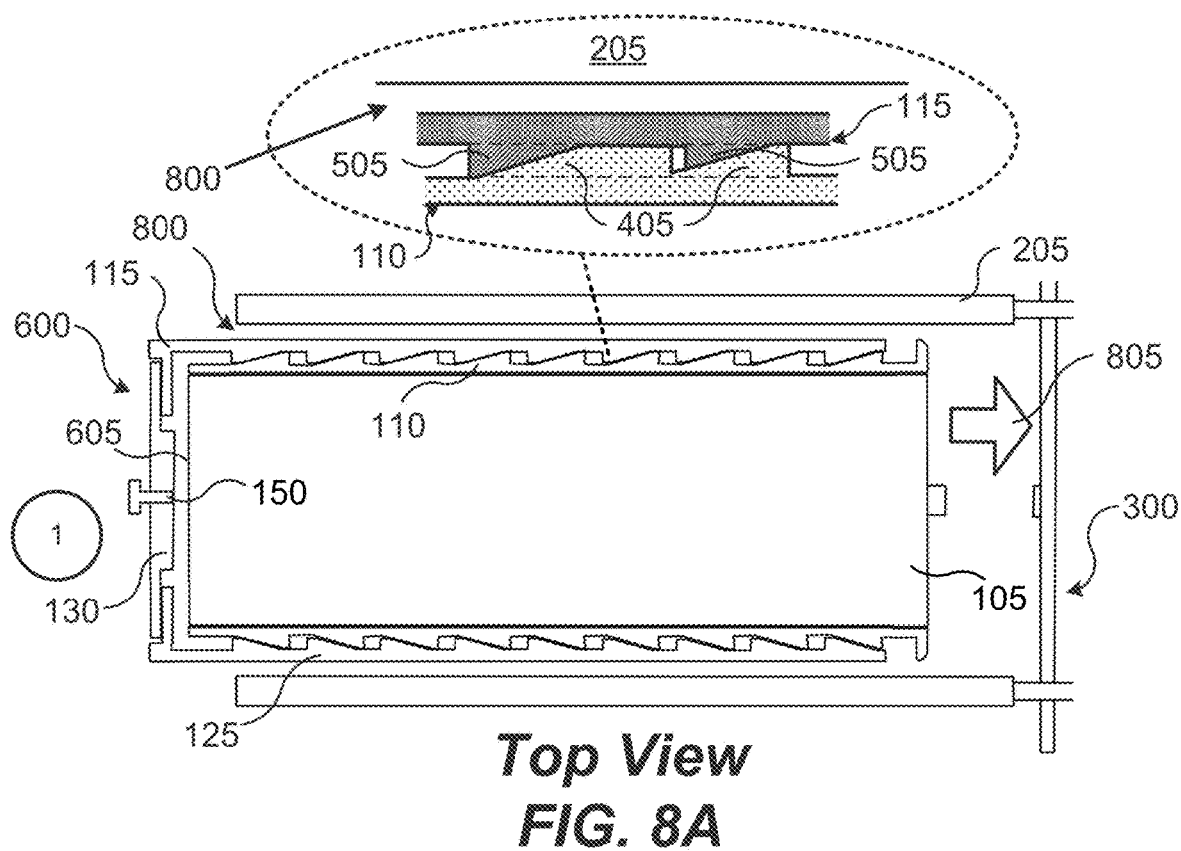
FIG. 8 (comprising FIGS. 8A-8D) illustrates a top view of an exemplary sequence for installing an exemplary device with heat spreaders and moveable heat spreaders.

FIG. 8A illustrates a top view of the device 100 that includes the housing 105, the heat spreaders 110 and 120, and the moveable heat spreaders 115 and 125. The device 100 is located between the cold plates 205, such that the device connector 410 is not coupled to the backplane connector 310. The configuration 600 of FIG. 6 can be moved between the cold plates 205 because the distance between the outer surfaces of the moveable heat spreaders 115 and 125 is less than the distance between the inside surfaces of the cold plates 205. FIG. 8A illustrates a gap 800 between the moveable heat spreader 115 and the cold plate 205. There may be a similar gap 800 between the moveable heat spreader 125 and the cold plate 205. The movement arrow 805 indicates that the device 100 is moving in the install direction. In FIG. 8A, the device connector 410 is not coupled to the backplane connector 310. The locking device 150 (e.g., screw, actuator screw) is shown located in the front face 130. In some implementations, locking device 150 may touch and/or be partially threaded into a hole in the front of the housing 105 without locking the device 100 in place between the cold plates 205.

Figure 8B:
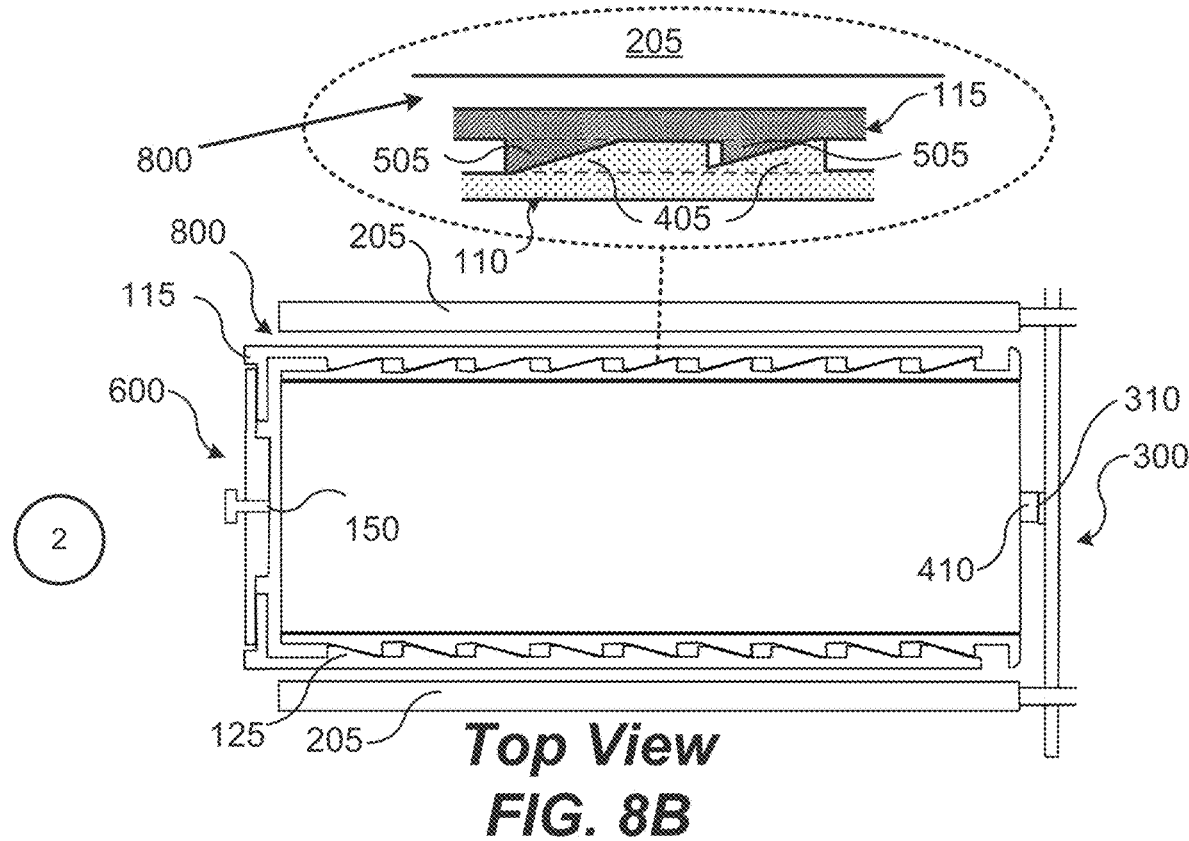

FIG. 8B illustrates a top view of the device 100 positioned between the cold plates 205, where device connector 410 is coupled (e.g., electrically coupled, plugged into) to the backplane connector 310. The moveable heat spreaders 115 and 125 may still be in a retracted position, as described in FIG. 6. As shown in FIG. 8, there is a gap 800 between the moveable heat spreader 115 and the cold plate 205.

Figure 8C:
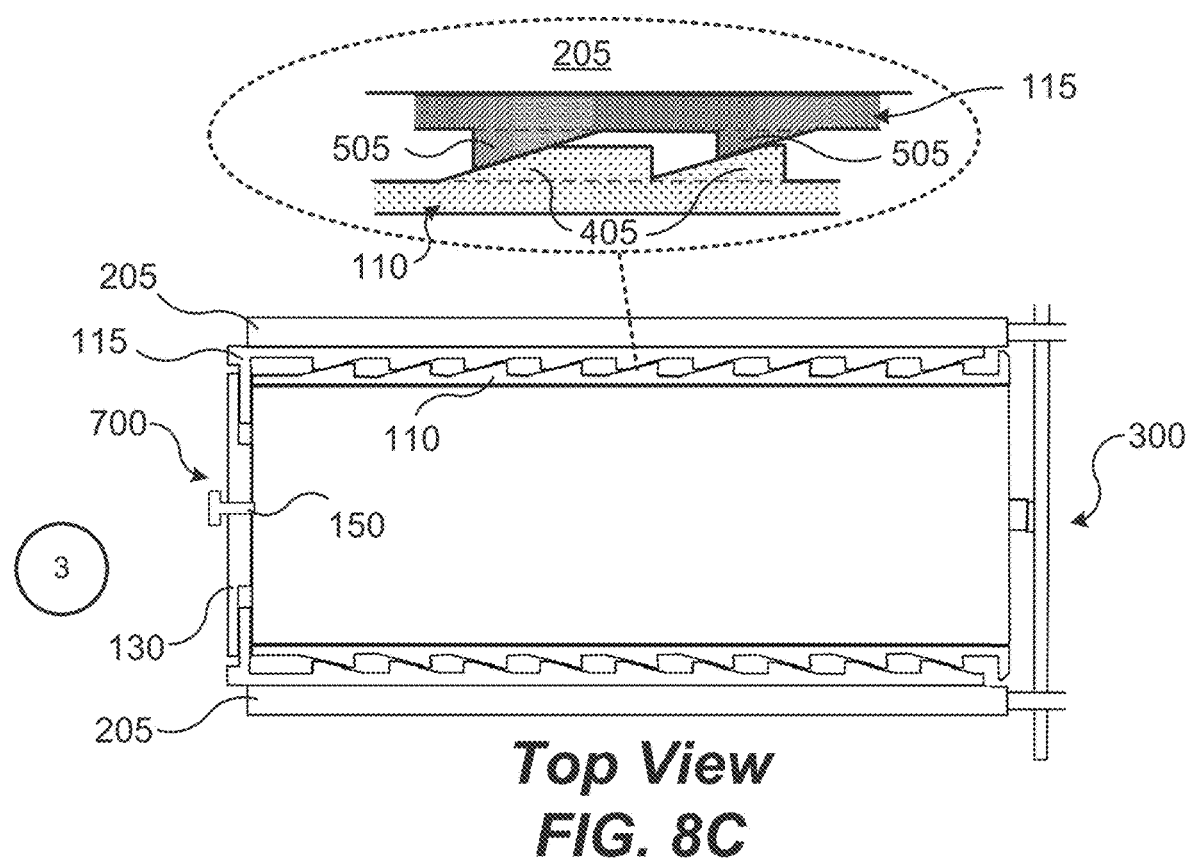

FIG. 8C illustrates a top view of the device 100 in the configuration 700. The moveable heat spreaders 115 and 125 may be in an extended position such that the moveable heat spreaders 115 and 125 are coupled (e.g., touching) the cold plates. The front face 130 may be touching the housing 105. However, in some implementations, the front face 130 may not be touching the housing 105. Pressing the front face 130 toward the housing 105 can move the front face 130 toward the housing 105, and push the moveable heat spreaders 115 and 125 towards their respective cold plates 205. As the front face 130 is pushed towards the housing 105, the outer wedges 505 of the moveable heat spreaders 115 and 125 may move along the wedges 405 of the heat spreaders 110 and 120, which moves the moveable heat spreaders 115 and 125 away from the housing 105 and towards a respective cold plate 205. For example, a tapered surface of the outer wedges 505 (of the moveable heat spreaders 115 and/or 125) may move along a tapered surface of the wedges 405 (of the heat spreaders 110 and/or 120).

FIG. 8C shows the locking device 150 threaded into a hole in the housing 105 but not pressing the front face 130 towards the housing 105. The front face 130 can be pressed toward the housing 105 by turning the locking device 150 such that the locking device 150 is threaded into a hole in the front face 130 and the housing 105, and by tightening the locking device 150 such the locking device 150 presses or otherwise forces the front face 130 toward the housing 105.

Figure 8D:
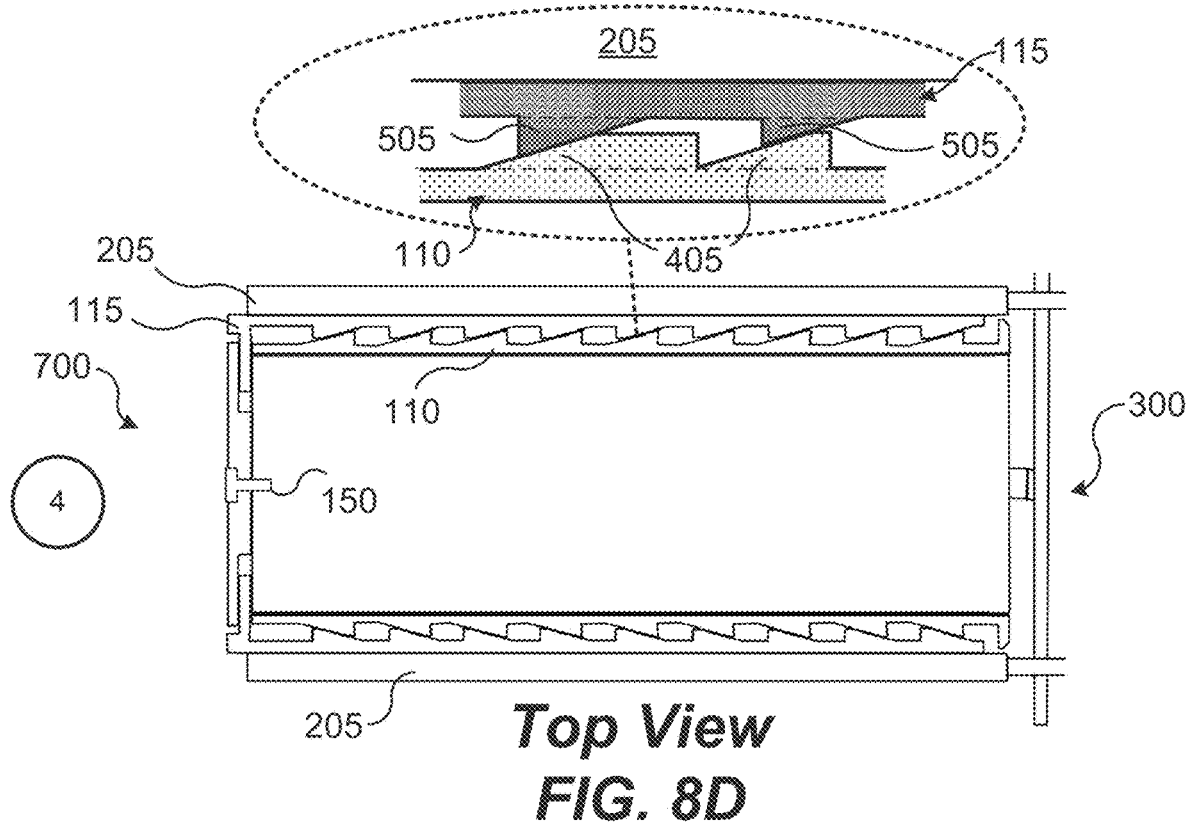

FIG. 8D illustrates a top view of the device 100. The device 100 may be in a locked configuration. In particular, the locking device 150 may be coupled to the front face 130 and the housing 105, such that the front face 130 and the moveable heat spreaders 115 and 125 are in a fixed position. The locking device 150 may be threaded into the housing 105 such that the moveable heat spreaders 115 and 125 press against (with force) against the cold plates 205 and lock the device 100 and the housing 105 in place between the cold plates 205.

When the device 100 is positioned in the chassis 200 with the at least one moveable heat spreader (e.g., 115, 125) coupled (e.g., touching, in contact) with the at least one cold plate 205, heat from one or more electronic devices can be thermally conducted from the housing 105, through the at least one heat spreader (e.g., 110, 120), through the at least one moveable heat spreader (e.g., 115, 125), and to the at least one cold plate 205.

To decouple the device 100 from the cold plates 205 and/or the chassis 200 that includes the cold plates 205, the process may perform the above operation in reverse order. In FIGS. 8A-8D the illustrated device 100 has the heat spreaders 110 and 120 and the moveable heat spreaders 115 and 125. However, different implementations may have different numbers of heat spreaders and/or moveable heat spreaders on different surfaces (e.g., front surface, top surface, bottom surface, side surface, left surface, right surface) of the housing 105. In some implementations, the heat spreaders and/or moveable heat spreaders may be located on opposite surface of the housing 105, which may help provide a balance approach to pushing the moveable heat spreaders 115 and 125 towards the cold plates, which can help minimize stress on the housing 105, the device connector 410 and/or the backplane connector 310. The at least one heat spreader (e.g., 110, 120) may have at least one wedge (e.g., 405), and the at least one outer heat spreader (e.g., 115, 125) may have at least one outer wedge (e.g., 505). The shape and/or sizes of the wedges and/or outer wedges may vary with different implementations. Different implementations of the heat spreader and/or outer heat spreader may have a different number of wedges and/or outer wedges. In some implementations, the at least one heat spreader (e.g., 110, 120) may include at least one protrusion that has a non-wedge shape. The protrusion may be part of the heat spreader or may be coupled to the heat spreader. In some implementations, the at least one outer heat spreader (e.g., 115, 125) may include at least one outer protrusion that has a non-wedge shape. The outer protrusion may be part of the outer heat spreader or may be coupled to the outer heat spreader. The protrusions and/or outer protrusions may move along at least one wedge and/or at least one outer wedge. In one example, the at least one heat spreader (e.g., 110, 120) may include at least one wedge (e.g., 405), and the at least one outer heat spreader (e.g., 115, 120) may include at least outer protrusion that has a non-wedge shape. In one example, the at least one heat spreader (e.g., 110, 120) may include at least one protrusion that includes a non-wedge shape, and the at least one outer heat spreader (e.g., 115, 120) may include at least one outer wedge (e.g., 505). However, it is noted that the use of protrusions with non-wedge shapes may not provide optimal heat transfer capabilities, since there may be less contact between the heat spreader and the outer heat spreader.

Figure 9B:
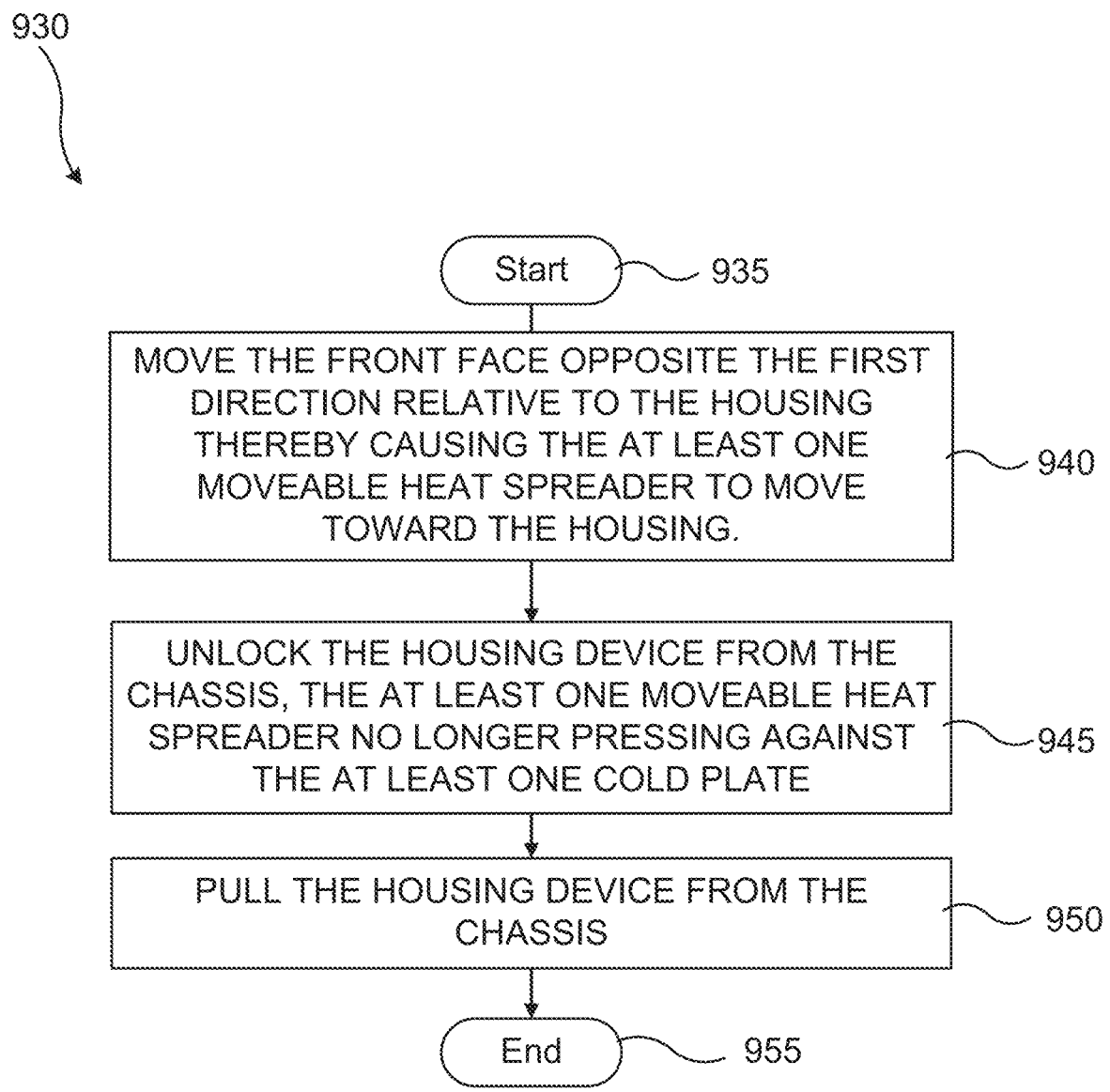
FIG. 9 (comprising FIGS. 9A-9B) illustrates exemplary flow diagrams of methods for installing a device in a chassis and for removing the device from the chassis.

FIG. 9 (comprising FIGS. 9A-9B) illustrates exemplary flow diagrams of methods for installing a device in a chassis and for removing the device from the chassis. In some implementations, installing the device 100 and locking it in a chassis 200 includes several steps. FIG. 9A illustrates an exemplary flow diagram of a method 900 for installing a device 100 in a chassis 200. After the start 905, the device 100 is inserted (at 910) into a chassis 200. The chassis 200 includes at least one cold plate 205 that is configured to be actively cooled. The device 100 may include (i) a housing configured as an enclosure for electronic devices, (ii) at least one heat spreader (e.g., 110, 120) is coupled to at least one surface of the housing 105, wherein the at least one heat spreader (e.g., 110, 120) comprises at least one wedge (e.g., 405); (iii) at least one moveable heat spreader (e.g., 115, 125) is coupled to the at least one heat spreader (e.g., 110, 120), wherein the at least one moveable heat spreader (e.g., 115, 125) is configured to be moveable relative to the housing 105 and/or the at least one heat spreader (e.g., 110, 120), wherein the at least one moveable heat spreader (e.g., 115, 125) includes at least one outer wedge (e.g., 505) configured to couple to the at least one wedge of the at least one heat spreader (e.g., 110, 120), wherein at least one outer wedge (e.g., 505) is in slidable contact with the at least one wedge (e.g., 405) such that pressing the at least one moveable heat spreader (e.g., 115, 125) in a first direction causes the at least one moveable heat spreader (e.g., 115, 125) to slide against the at least one heat spreader (e.g., 110, 120) and move away from the housing 105; and (iv) a front face 130 coupled to the at least one moveable heat spreader (e.g., 115, 125) such that pressing the front face 130 in the first direction presses the at least one moveable heat spreader (e.g., 115, 125) in the first direction.

When the device 100 has been inserted into the chassis 200; the front face 130 can be moved or actuated (at 915) in the first direction relative to the housing 105 and/or the heat spreader (e.g., 110, 120) which can cause the at least one moveable heat spreader (e.g., 115, 125) to press against at least one of the at least one cold plate (e.g., 205). Next, the device 100 can be locked (at 920) in place within the chassis 200. The at least one moveable heat spreader (e.g., 115, 125) pressing against the at least one cold plate 205 to hold the device 100 in place within the chassis 200.

Positioning and/or inserting the device 100 into a chassis 200 may include choosing an open bay in the chassis 200. When there is no open bay, a bay can be opened by removing a different device 100 from the chassis 200. The device 100 is moved into the bay and pushed back into the bay until the device connector 410 is coupled to the backplane connector 310. The device 100 may be fully inserted when the device connector 410 is coupled to the backplane connector 310.

The front face 130 may be coupled to the at least one moveable heat spreader (e.g., 115, 125) such that pushing the front face 130 in the first direction pushes the at least one moveable heat spreader (e.g., 115, 125) a direction that includes the first direction. The moveable heat spreaders may be coupled to the front face 130 through a plurality of couplers 135 or other means for coupling that couple the at least one moveable heat spreader (e.g., 115, 125) to the means for moving the at least one moveable heat spreader.

The chassis 200 includes at least one cold plate 205 that is configured to be actively cooled. The chassis 200 can have a number of bays into which devices 100 can be installed. Each of the bays can provide access to one or more cold plates for cooling the device 100. The chassis 200 illustrated in FIG. 17 has five bays with each bay providing access to at least two cold plates 205. However, different implementations may include different numbers of cold plates for each bay.

In some implementations, removing the device 100 locked in a chassis 200 includes several steps. FIG. 9B illustrates an exemplary flow diagram of a method 930 for removing a device 100 locked in a chassis 200. After the start 935, the front face 130 is moved (at 940) in a direction opposite to the first direction relative to the housing 105 thereby causing the at least one moveable heat spreader (e.g., 115, 125) to move toward the housing 105. The device 100 is unlocked (at 945) from the chassis 200, and the at least one moveable heat spreader (e.g., 115, 125) is no longer pressing against the at least one cold plate 205. The device 100 can then be pulled (at 950) from the chassis.

Figure 10:
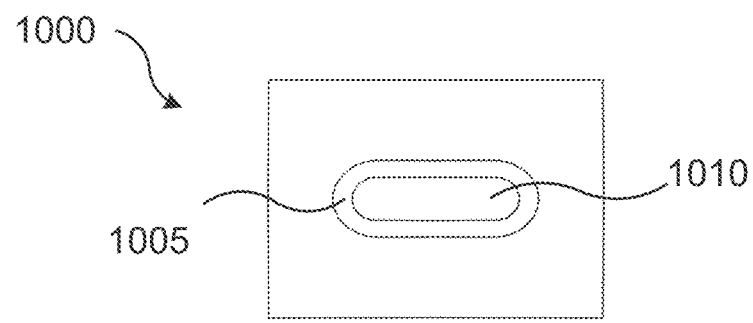
FIG. 10 illustrates a top view of an exemplary shoulder screw slot or an exemplary sliding nut slot.

FIG. 10 illustrates a top view of an exemplary shoulder screw slot 1000 or an exemplary sliding nut slot. Here, the same structure has two names because it can be used in the couplers 135 and in the heat spreader couplers 145. The shoulder screw slot 1000 has a fully open slot 1010 and a shoulder 1005. The fully open slot 1010 is drilled completely though. The shoulder provides a surface for a shoulder screw or a sliding nut to slide on.

Figure 11:
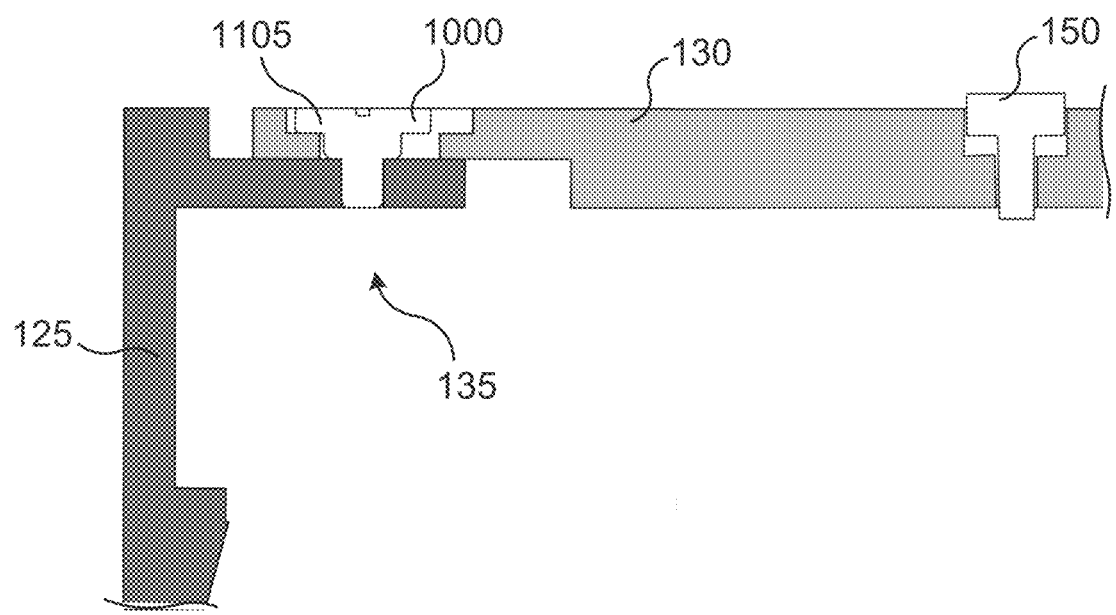
FIG. 11 illustrates a cross sectional view of an exemplary moveable heat spreader slidably coupled to an exemplary front face.

FIG. 11 illustrates a cross sectional view of the moveable heat spreader 125 coupled to the front face 130. A shoulder screw 1105 may be installed in the shoulder screw slot 1000 and threaded into the moveable heat spreader 125 to form a coupler 135 between the front face 130 and the moveable heat spreader 125. Different implementations may include a different number of couplers 135. A single coupler 135 would allow the moveable heat spreader 125 to rotate using the shoulder screw 1105 as a pivot. The at least one shoulder screw 1105 is installed in the at least one shoulder screw slot 1000 and is slidably coupling the at least one moveable heat spreader 125 to the front face 130 such that the at least one moveable heat spreader 125 slides relative (e.g., perpendicularly) to a front face normal 515.

Figure 12:
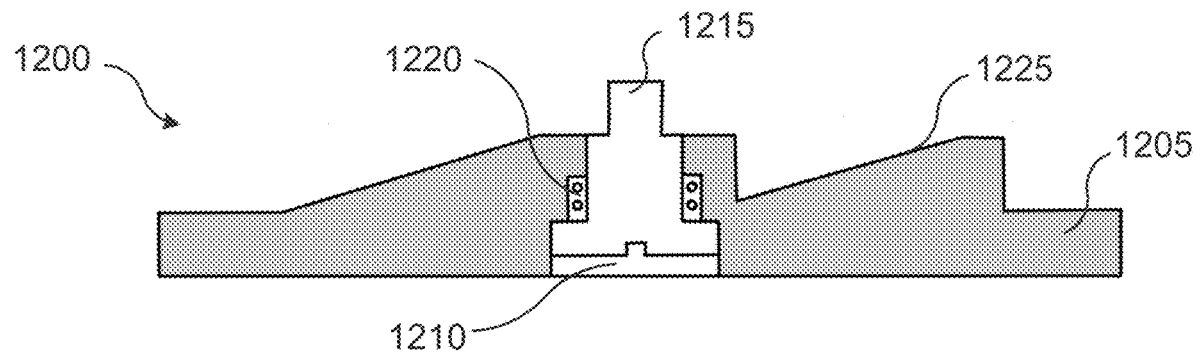
FIG. 12 illustrates an exemplary heat spreader with an exemplary tensioned shoulder screw.

FIG. 12 illustrates the heat spreader 1205 with an exemplary tensioned shoulder screw 1215. The heat spreader 1205 may be represent a portion of the heat spreader 110 and/or 120. The tensioned shoulder screw 1215 is installed in a hole 1210 in the heat spreader 1205. The tensioned shoulder screw 1215 is tensioned because a spring 1220 is pressing it from the hole 1210. The wedge 1225 of heat spreader 1205 has an angled face. The heat spreader 1205 with spring 1220 and tensioned shoulder screw 1215 can be called a wedge assembly 1200.

Figure 13:
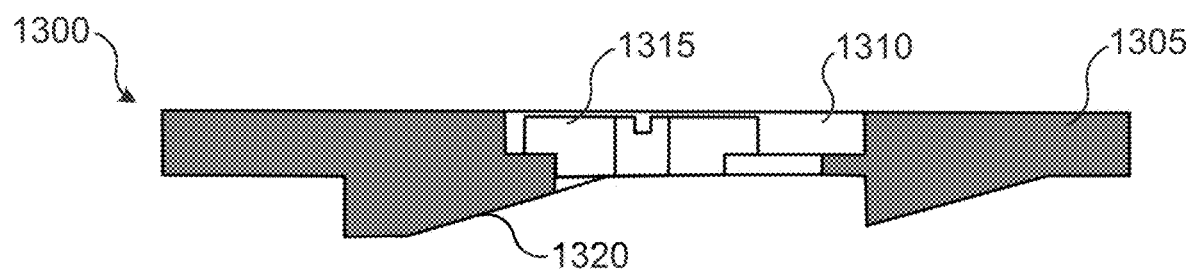
FIG. 13 illustrates an exemplary moveable heat spreader with an exemplary sliding nut.

FIG. 13 illustrates an exemplary moveable heat spreader 1305 that includes an exemplary sliding nut 1315. The moveable heat spreader 1305 may represent a portion of the moveable heat spreader 115 and/or 125. The sliding nut 1315 is positioned in a sliding nut slot 1310 which has a fully open slot and a shoulder as shown in FIG. 10. The moveable heat spreader 1305 includes an outer wedge 1320 that has an angled face. The angles of the wedge 1225 and the outer wedges 1320 may have approximately the same angles such that the wedges and outer wedges form contact regions. The moveable heat spreader 1305 with a sliding nut 1315 in its sliding nut slot 1310 can be called an outer wedge assembly 1300.

Figure 14A:
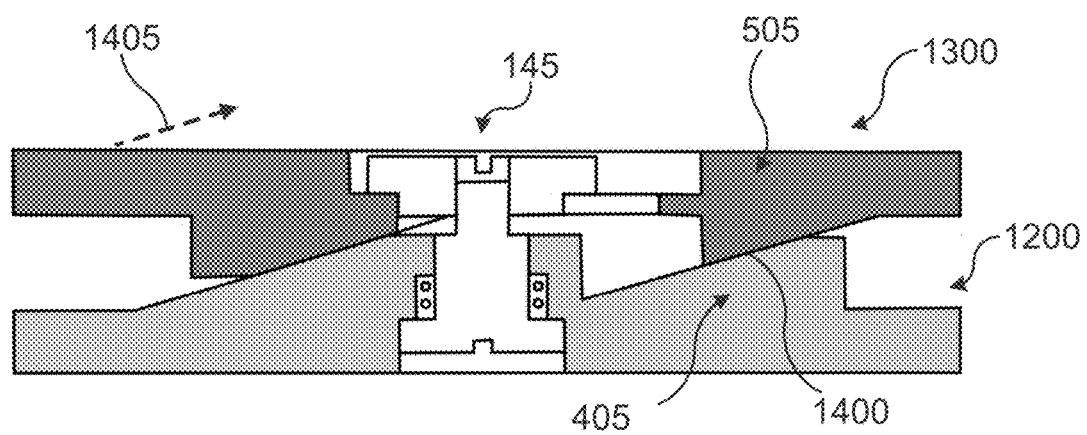
FIG. 14 (comprising FIGS. 14A-14B) illustrates an exemplary heat spreader fastener pulling an exemplary moveable heat spreader into slidable contact with an exemplary heat spreader.
Figure 14B:
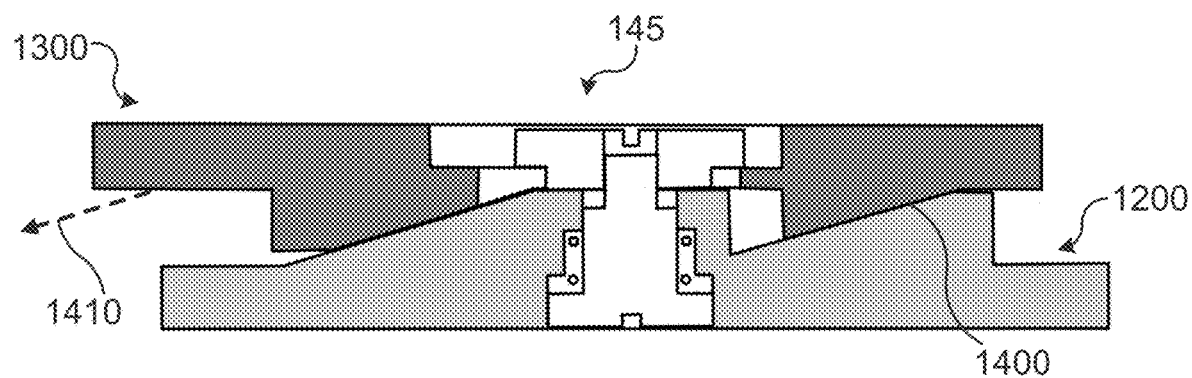

FIG. 14 (comprising FIGS. 14A-14B) illustrates an exemplary heat spreader coupler 145 pulling an exemplary moveable heat spreader 1305 into slidable contact with an exemplary heat spreader 1205. The outer wedge assembly 1300 is slidably coupled to the wedge assembly 1200 by threading tensioned shoulder screw 1215 into sliding nut 1315. The spring 1220 is pulling moveable heat spreader 1305 into slidable contact with heat spreader 1205. A contact region 1400 is formed where the wedge 405 and an outer wedge 505 are in contact. In FIG. 14A, the moveable heat spreader 1305 is positioned as far as it can go from the housing 105 (not shown) because the sliding nut 1315 is at the first end of the sliding nut slot 1310. Sliding the moveable heat spreader 1305 such that the sliding nut 1315 moves toward the second end of the sliding nut slot 1310 would allow the spring 1220 to pull the moveable heat spreader 1305 closer to the housing 105. In the nonlimiting example of FIG. 14B, the moveable heat spreader 1305 is positioned as close as it can get to the housing 105 (not shown) because the sliding nut 1315 is contacting the head spreader 1205. Sliding the moveable heat spreader 1305 such that the sliding nut 1315 moves back to the first end of the sliding nut slot 1310 causes the wedges 405 and outer wedges 505 to push the moveable heat spreader 1305 further from the housing 105. The heat spreader coupler 145 is an example of means for pulling the moveable heat spreader 1305 toward the housing 105.

In a device, each of the at least one moveable heat spreader (e.g., 115, 125, 1305) can include a plurality of sliding nut slots with each of the heat spreader fasteners including a plurality of sliding nuts positioned in the plurality of sliding nut slots.

The device 100 of FIG. 1 is configured for the moveable heat spreaders 1305 to move away from the housing 105 as the front face 130 is moved toward the housing 105 because the outer wedges 505 slide on the wedges 405 and move the moveable heat spreader 1305 in a direction of outward movement 1405 relative to the heat spreader 1205. FIG. 14A shows the direction of outward movement 1405 of the moveable heat spreader 1305 relative to the heat spreader 1205. As the front face 130 is moved away from the housing, the outer wedges 505 slide on the wedges 405 and move the moveable heat spreader 1305 in a direction of inward movement 1410 relative to the heat spreader 1205. FIG. 14B shows that the direction of inward movement 1410 is opposite the direction of outward movement 1405.

Figure 15:
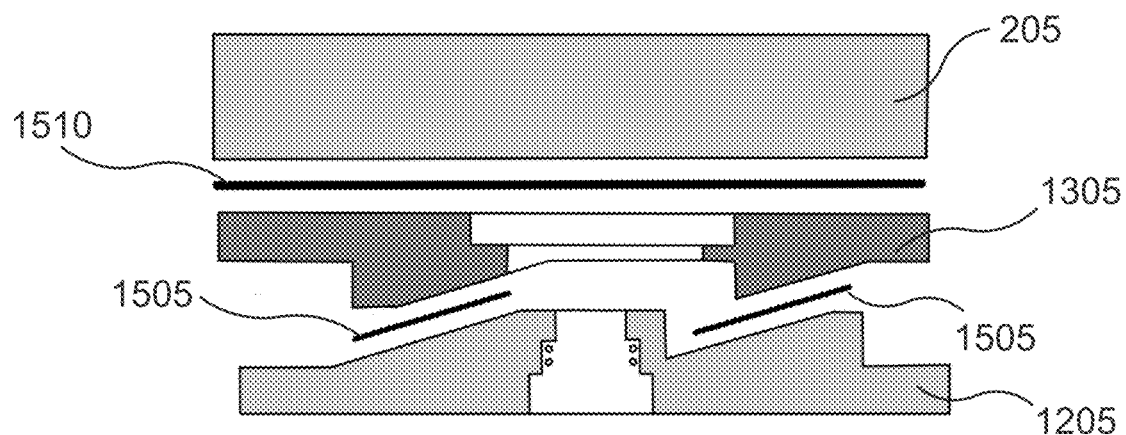
FIG. 15 illustrates exemplary thermal conductor between an exemplary moveable heat spreader and an exemplary heat spreader.

FIG. 15 illustrates exemplary thermal conductor 1505 between an exemplary moveable heat spreader 1305 and an exemplary heat spreader 1205. The device 100 and the chassis 200 is designed and configured to provide efficient conduction of heat from electronics in the housing 105 to the fluid in the cold plates 205. Cooling efficiency can be increased by a thermal conductor 1505 at the contact region 1400 between the wedges 405 and the outer wedges 505. A thermal conductor such as a thermal grease, graphite, or other material that does not fixedly adhere the wedges 405 to the outer wedges 505 can be used. Additional thermal conductor 1510 between the moveable heat spreader 1305 and the cold plate 205 can increase thermal conduction at that interface. Thermal conductors that adhere pieces together, such as heat sink compound, can result in the moveable heat spreaders 1305 being stuck to the cold plates 205 and/or to the heat spreaders 1205. In such a case, the device 100 would be very difficult to remove from the chassis 200. The thermal conductor (e.g., 1505, 1510) may include a non-solid material.

Figure 16:
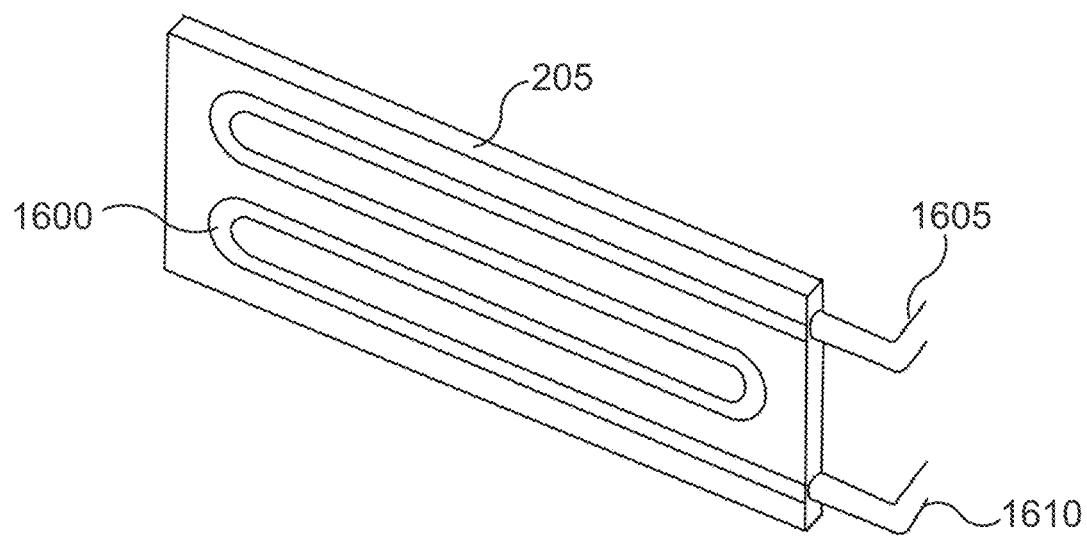
FIG. 16 illustrates an exemplary cold plate configured for active cooling.

FIG. 16 illustrates an exemplary cold plate 205 configured to be actively cooled. A fluid (e.g., coolant) may flows through an inflow tube 1605 and then into the cold plate 205 where it flows through internal channels 1600. After flowing through the internal channels 1600, the fluid can exit the cold plate 205 by flowing out through an outflow tube 1610. After exiting the cold plate 205, the fluid will have been heated by heat generated by electronics within the housing 105, which has been conducted through the heat spreaders and the moveable heat spreaders. The heated fluid can then be cooled using cooling towers, chillers, radiators, or one of the other well-known means for removing heat from a coolant. Having been cooled, the coolant can again flow through a cold plate. Alternatively, the cold plate 205 can be cooled thermoelectrically. Thermoelectric devices use electric power to achieve a cooling effect.

Figure 17:
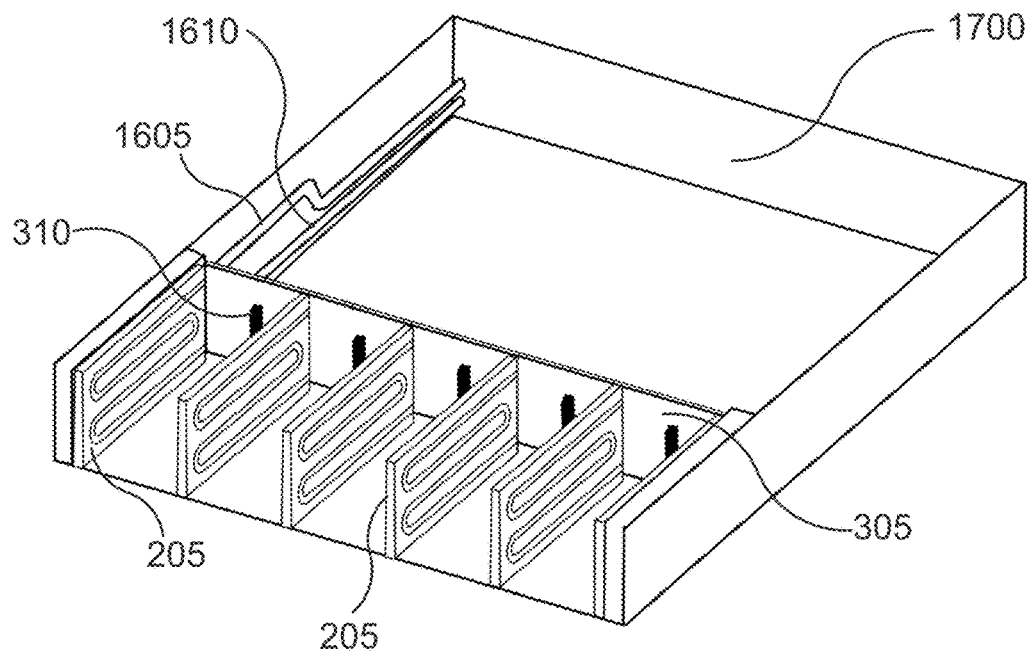
FIG. 17 illustrates an exemplary chassis with exemplary cold plates and exemplary bays for exemplary electronics enclosures.

FIG. 17 illustrates an exemplary chassis 1700 with six exemplary cold plates 205 and five exemplary bays for exemplary devices 100. Here, the chassis top is removed to expose the chassis interior. A backplane 305 extends the width of the chassis 1700 and has a plurality of backplane connectors 310. The device connector 410 of the device 100 may be coupled (e.g., electrically coupled, plugged) to the backplane connector 310. The term "plugged" may mean that two matching connectors have been joined to form mechanical and electrical connections. An inflow tube 1605 enters the chassis 1700 and provides a fluid that flows into the cold plates 205. An outflow tube 1610 exits the chassis 1700 such that fluid can flow from the cold plates 205 and out the chassis 1700. The inflow tube 1605 can be connected to all the cold plates 205. The outflow tube 1610 can be connected to all the cold plates 205. The outflow tube 1610 of a cold plate 205 can be coupled to the inflow tube 1605 of a neighboring cold plate such that the fluid travels through multiple cold plates 205 before exiting the chassis 1700.

Figure 18:
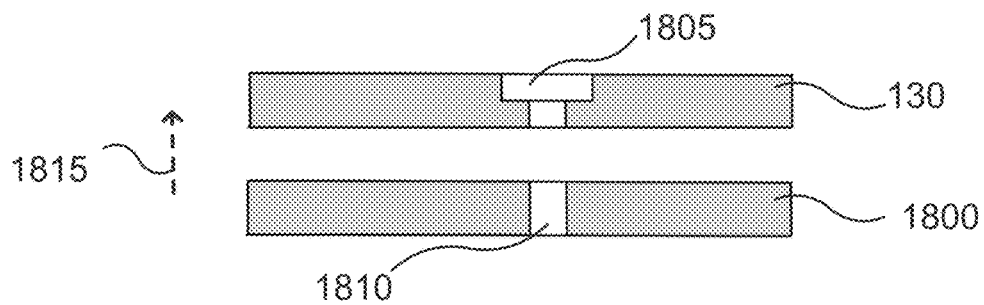
FIG. 18 illustrates an exemplary front face and an exemplary housing front.

FIG. 18 illustrates an exemplary front face 130 and an exemplary housing front 1800. The front face 130 has a recessed hole 1805 (e.g., recessed actuator screw hole) that is not threaded such that a locking device 150 can turn freely within the recessed hole 1805. A threaded hole 1810 (e.g., threaded actuator screw hole) in the housing front 1800 is threaded to engage the threads of the locking device 150. As described above, a plurality of springs 1220 exert a force pulling the moveable heat spreaders 1305 toward the heat spreaders 1205. The outer wedges 505 and the wedges 405 redirect that force into a frontward force 1815 pushing the front face 130 away from the housing front 1800 of the housing 105.

Figure 19:
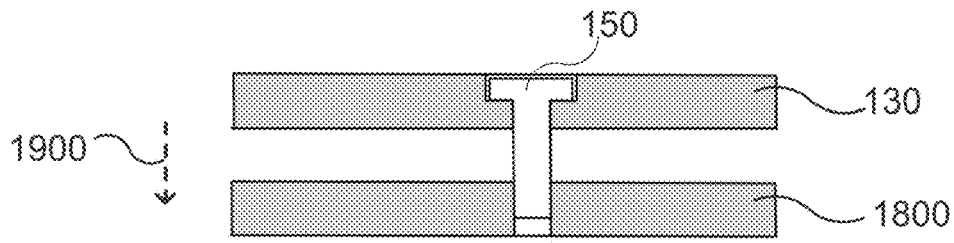
FIG. 19 illustrates an exemplary front face and an exemplary housing front with an exemplary actuator screw.

FIG. 19 illustrates an exemplary front face 130 and an exemplary housing front 1800 with an exemplary actuator screw (e.g., the locking device 150 in FIG. 1). The locking device 150 is positioned within the recessed hole 1805 and threaded into the threaded hole 1810. Tightening the locking device 150 forces the front face 130 in a rearward direction 1900 and closer to the front of the housing 105. The movement of the front face 130 pushes the moveable heat spreaders 1305 such that the wedges 405 and the outer wedges 505 slide against one another thereby redirecting movement of the front face and causing the moveable heat spreader 1305 to move away from the housing 105.

Different implementations may arrange the cold plates, heat spreaders, and moveable heat spreaders differently. In some implementations, the housing may be positioned directly against a cold plate while a single moveable heat spreader is pressed against a cold plate on the opposite side of the housing. The wedges and outer wedges in the illustrations are angled such that moving the moveable heat spreader toward the back of the chassis causes the moveable heat spreader to move away from the housing. Alternatively, the wedges and outer wedges can be angled such that moving the moveable heat spreader away from the back of the chassis causes the moveable heat spreader to move away from the housing. In such an embodiment, the locking device 150 can press against the front of the housing without being threaded into a hole in the front of the housing because the force from the plurality of springs 1220 would pull the front face toward the housing. The handle can have a cam arrangement such that pulling the handle straight (or alternatively pushing it down as seen in FIG. 1) moves the front face to cause the moveable heat spreaders to move toward the housing, thereby releasing the electronics enclosure from the chassis. Such a cam arrangement can be configured such that pushing the handle down as seen in FIG. 1 (or alternatively pulling it straight) moves the front face to cause the moveable heat spreaders to move away from the housing, thereby locking the electronics enclosure in place in the chassis.

Variations of the device 100 can have one or more heat spreaders that are fixedly attached to the housing or that are integrally formed as parts of the housing. Fixedly attached heat spreaders can be coupled to the housing by screws, adhesives, or other means. Joining a heat spreader to the housing can prevent the heat spreader from moving relative to the housing. Alternatively, a heat spreader can be a wall of the housing such that an inside surface of the housing is a surface of the heat spreader and an outside surface of the housing has one or more wedges configured to slidably couple with the outer wedges of a moveable heat spreader. If an inside surface of the housing is a surface of the heat spreader then the housing includes the heat spreader and the heat spreader includes an inside surface of the housing.

Exemplary Positions of Cold Plates and Heat Spreaders Relative to a Housing

Figure 20:
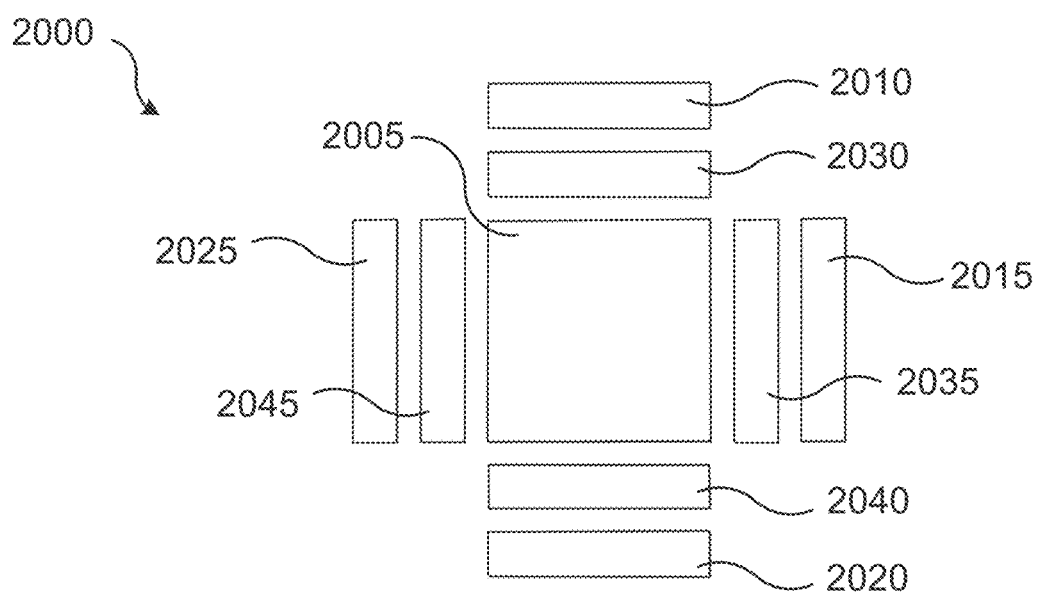
FIG. 20 illustrates different positions of exemplary cold plates and exemplary heat spreader assemblies relative to an exemplary housing.

FIG. 20 illustrates different positions of exemplary cold plates 2010, 2015, 2020, 2025 and exemplary heat spreader assemblies 2030, 2035, 2040, 2045 relative to an exemplary housing 2005. Here, the heat spreader assemblies 2030, 2035, 2040, 2045 indicate moveable heat spreaders attached to heat spreaders. The heat spreader assemblies are top heat spreader assembly 2030, right heat spreader assembly 2035, bottom heat spreader assembly 2040, and left heat spreader assembly 2045. The cold plates are top cold plate 2010, right cold plate 2015, bottom cold plate 2020, and left cold plate 2025.

The housing 2005 can be pressed directly against a cold plate 2010, 2015, 2020, 2025 if there is no heat spreader assembly between the housing 2005 and the cold plate 2010, 2015, 2020, 2025. For example, if there is no bottom heat spreader assembly 2040 then the housing 2005 can be pressed against bottom cold plate 2020 when the top heat spreader assembly 2030 expands to press against the top cold plate 2010. Recalling that a heat spreader assembly is a moveable heat spreader slidably attached to a heat spreader, a heat spreader assembly expands when the moveable heat spreader moves away from the housing. Numerous variations are possible based on which heat spreader assemblies are present. There are four variations having exactly three heat spreader assemblies. There are two variations having heat spreader assemblies only on opposite side of the housing. There are four variations having heat spreader assemblies on adjacent sides of the housing. There are four variation having heat spreader assemblies on only one side of the housing.

An example having two heat spreader assemblies can have a first moveable heat spreader located at one surface of the housing and coupled to a first heat spreader that is on the first surface. A second moveable heat spreader can be located at a second surface of the housing and coupled to a second heat spreader that is on the second surface. The second surface can be opposite the first surface such that the heat spreader assemblies are on opposite sides of the housing.

Exemplary Systems with Cold Plate Cooling

Systems with cold plate cooling include systems can have liquid cold plate devices, such as that of FIG. 16, that enhance the heat dissipation from hot surfaces for electronics that are mounted or plugged into the system. The system can have cooling liquid that passes through the cold plates to remove the heat from the system and transfer the heat to a cooling tower outside of the system. The cold plate combines the effects of a conductive heatsink with convection heat transfer to reduce the impedances between the generating heat source and the thermal sink. The systems can have improved thermal bonding between removable electronics enclosures and cold plates/cooling systems by using moveable heat spreaders that press against the cold plates. The moveable heat spreaders can simplify usability and serviceability of the electronics enclosure, while still maintaining a very good thermal bonding when the electronics enclosure is installed in the system.

The electronics enclosure system herein described can be scaled to be used on any type of removable electronic modules, not limiting to just SSD, NVME, M2 (PCI-SIG M.2 is a specification for internally mounted SSDs published by PCI-SIG, an Oregon Nonprofit Corporation), HDD's (Hard Disk Drive), etc., for example, it can be a full-fledged line card in a rack system. The thermal bonding area is increased due to the shape of the contact patches and can be tweaked based on space availability. The design allows for uniform locating of the removable electronics enclosure without any stress to the connectors. Features for thermal bonding can be built into the electronics enclosure itself or can be designed to be separate attachments to the electronics enclosure. For example, the heat spreader assemblies can be sub-assemblies for attachment to the electronics enclosures. Thermally conductive parts such as housings, heat spreaders, moveable heat spreaders, or cold plates can be of any highly thermally conductive material such as aluminum or copper. The parts can be graphite coated as well to thereby reduce friction such as the friction at the contact patches. Thermal grease can provide a similar functionality at the contact patches.

The simple wedge-shaped interface mechanism disclosed herein allows proper thermal contact to the cold plate system when the electronics enclosure is inserted into a chassis or other compatible system having cold plates. The mechanism allows for easy removal when unplugging the electronics enclosure and creates a very efficient thermal bonding when the electronics enclosure is plugged and locked into the system. The parts of the heatsinking elements are designed to allow for cross directional movement based on insertion and removal. Uniform and symmetric movement allows the electronics enclosure to interface into the connecting system without stress by maintaining alignment to the connector system. The mechanism can be tool-less, where no tools are required to plug and unplug the electronic module from system. Such a tool-less implementation can use a thumb screw or similar hand turnable screw as an actuator screw.

Exemplary Electronic Devices, Systems, and Environments

Replaceable electronics modules having moveable heat spreaders that can press into cold plates provide improvements in both stationary and mobile systems. With respect to stationary systems, the electronics modules provide increased cooling for systems that are difficult or impossible to cool with forced air cooling. Mobile systems can also benefit.

We are witnessing increasing applications of sensors, microprocessors and on-board computers with GPU augmentation in fossil fuel-based, hybrid and fully electric automobiles. The latest innovations require high-performance on-board computers to perform many complex functions such as V2V (vehicle to vehicle) and V2X (vehicle to elsewhere) communications, intelligent traffic systems, managing on board ECUs and sensors, advanced vision processing, object recognition, and many others. The hardware used to do sensing may include camera systems, lasers, LiDARs, wireless communication systems, CMOS arrays, etc., all of which require thermal management of various complexity.

Although high performance computing systems are common in many consumer and enterprise applications, they are not yet ready to be deployed under the harsh operating conditions of an automobile. Furthermore, managing heat dissipations in components is exacerbated by elevated operating temperatures in an automobile where the ambient temperatures range from −400 C to −1500 C. For ECUs (Electronic Control Units) under the hood, the ambient temperature can be as high as 1050 C which drastically shrinks the thermal budget for the components.

In the automotive application context, the cooling surfaces for module level or chip-level cold plates have heat-sinks with pin-fins or µ-channels where the sealed liquid works to remove heat via evaporation and condensation cycles. Liquid cooling is the future for all high-end automotive electronics applications. Having harsh environment exposure, all electronics need to be sealed from the external environment and cooling can be achieved only through conduction into a cold plate.

Automobile life spans are higher than the electronics inbuilt into the automobile, resulting in a need to upgrade the various electronic systems inside the automobile while the base remains the same. ECU or Entertainment systems can be designed to be modular as we move into future with replacing the modules being a requirement. The electronics need to be replaced while maintaining good thermal bonding between the module and the liquid cooling system in the automobile. It is anticipated that vehicles with cold plates will be marketed and that the electronics enclosures described herein provide an ideal solution for cooling field replaceable electronics in such vehicles.

Similarly to the automotive space, military applications and aerospace applications have harsh environments and various environmental restrictions requiring that electronics be sealed from the external world. Cooling is achieved by conduction into a cooling system such as liquid cooling or cold plate/vapor chamber etc.

Aircraft engineers today are charged with creating a More Electric Aircraft (MEA) with greater processing capabilities, while also minimizing the aircraft's weight and power consumption. With MEA, hydraulic and pneumatic systems are being replaced with electric systems. Combined with the addition of more high-end embedded computing systems, the need for liquid cooling on jets, helicopters, unmanned aerial vehicles, and other types of military and commercial aircraft is increasing. By moving from air cooling to liquid cooling, engineers can eliminate thermal restrictions that might otherwise force them to compromise on system performance.

The latest LRU (Line Replaceable Units) and various electronic modules in military applications are in need of liquid based cooling to achieve higher performance, efficiency, and reliability. Considering the life of aircraft and other military applications, electronic processing systems need to be designed to be modular for upgradation as we move into future. Replacing the modules are a requirement while maintaining the need to have a good thermal bonding between the module and the liquid cooling system in the aircraft, automobile, or other vehicle.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a housing configured as an enclosure for at least one electronic device;
a heat spreader coupled to at least one surface of the housing, wherein the heat spreader includes at least one wedge;
a moveable heat spreader coupled to the heat spreader,
wherein the moveable heat spreader is configured to be moveable relative to the housing,
wherein the moveable heat spreader includes at least one outer wedge configured to couple to the at least one wedge of the heat spreader,
wherein the at least one outer wedge is configured to be in slidable contact with the at least one wedge such that pressing the at least one moveable heat spreader in a first direction causes the moveable heat spreader to slide against the heat spreader and move away from the housing, and
wherein the moveable heat spreader includes a plurality of sliding nut slots; and
a plurality of fasteners configured to move the moveable heat spreader towards the heat spreader, wherein a first fastener from the plurality of fasteners includes a first sliding nut positioned in a first sliding nut slot from the plurality of sliding nut slots.

2. The device of claim 1, wherein the heat spreader further comprises:
a first heat spreader located over a first surface of the housing; and
a second heat spreader located over a second surface of the housing, wherein the second surface is opposite to the first surface, and
wherein the moveable heat spreader comprises:
a first moveable heat spreader slidably contacting the first heat spreader, and
a second moveable heat spreader slidably contacting the second heat spreader.

3. The device of claim 1, further comprising a front face coupled to the moveable heat spreader, wherein pressing the front face in the first direction causes the moveable heat spreader to move in the first direction.

4. The device of claim 3, wherein the moveable heat spreader is configured to move perpendicularly to the first direction relative to the front face.

5. The device of claim 3, further comprising:
a shoulder screw slot defined in the front face; and
a shoulder screw located in the shoulder screw slot, wherein the shoulder screw is configured to couple the moveable heat spreader to the front face such that the moveable heat spreader slides perpendicularly to the front face.

6. The device of claim 1, further comprising a plurality of shoulder screws, wherein the plurality of shoulder screws are configured to be coupled to the plurality of fasteners.

7. The device of claim 1, wherein each fastener from the plurality of fasteners includes a respective sliding nut configured to be positioned in a respective sliding nut slot from the plurality of sliding nut slots.

8. The device of claim 1, wherein the heat spreader is a separate component to the housing.

9. The device of claim 1, wherein the heat spreader is formed part of the housing.

10. The device of claim 1 wherein, when the device is configured to be inserted into a host chassis, heat from within the housing is conducted through the heat spreader, through the moveable heat spreader, and into a cold plate of the host chassis.

11. The device of claim 1, further comprising:
a plurality of shoulder screws, wherein the plurality of screws are configured to be coupled to the plurality of fasteners; and
a plurality of springs coupled to the plurality of shoulder screws,
wherein the plurality of shoulder screws include a first shoulder screw,
wherein the plurality of springs include a first spring,
wherein the first spring is coupled to the first shoulder screw, and
wherein the first shoulder screw is configured to be coupled to the first sliding nut.

12. The device of claim 11, wherein the first shoulder screw is a tensioned shoulder screw located in a first hole of the heat spreader.

* * * * *